(12) United States Patent
Fujita et al.

(10) Patent No.: US 7,671,397 B2
(45) Date of Patent: Mar. 2, 2010

(54) SWITCHING ELEMENT

(75) Inventors: Shinobu Fujita, Kawasaki (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 545 days.

(21) Appl. No.: 11/229,502

(22) Filed: Sep. 20, 2005

(65) Prior Publication Data

US 2006/0255395 A1    Nov. 16, 2006

(30) Foreign Application Priority Data

May 10, 2005 (JP) ............................. 2005-137411

(51) Int. Cl.
*H01L 29/788* (2006.01)
(52) U.S. Cl. ............ 257/315; 257/254; 257/415; 257/E29.167; 257/E29.325; 361/277
(58) Field of Classification Search ........ 257/254, 257/315, 415, E29.167, E29.324, E29.325; 361/277
See application file for complete search history.

(56) References Cited

U.S. PATENT DOCUMENTS

| | | | | |
|---|---|---|---|---|
| 6,160,230 | A | * | 12/2000 | McMillan et al. ........... 200/181 |
| 6,509,605 | B1 | * | 1/2003 | Smith .......................... 257/316 |
| 6,706,402 | B2 | | 3/2004 | Rueckes et al. |
| 6,781,166 | B2 | | 8/2004 | Lieber et al. |
| 2002/0153583 | A1 | | 10/2002 | Frazier et al. |

FOREIGN PATENT DOCUMENTS

| | | |
|---|---|---|
| EP | 1 398 811 A2 | 3/2004 |
| JP | 2001-23497 | 1/2001 |
| WO | WO 00/55918 | 9/2000 |

OTHER PUBLICATIONS

Thomas Rueckes, et al., "Carbon Nanotube-Based Nonvolatile Random Access Memory for Molecular Computing", Science, vol. 289, Jul. 7, 2000, pp. 94-97.
X. Rottenberg, et al., "MEMS near-DC to RF capacitive series switches", 33$^{th}$ European Microwave Conference-Munich, vol. 3, XP-010680814, Oct. 7, 2003, pp. 975-978.

* cited by examiner

*Primary Examiner*—Matthew E Warren
(74) *Attorney, Agent, or Firm*—Oblon, Spivak, McClelland, Maier & Neustadt, L.L.P.

(57) ABSTRACT

There is disclosed a switching element including a first input/output electrode, a movable portion which repeats contact/non-contact with respect to the first input/output electrode, a second input/output electrode connected with the movable portion, a floating gate electrode which is coupled with the movable portion through an insulating layer and in which electric charge is stored, and a first gate electrode which generates an electrostatic force between itself and the floating gate electrode to control an operation of the movable portion.

23 Claims, 21 Drawing Sheets

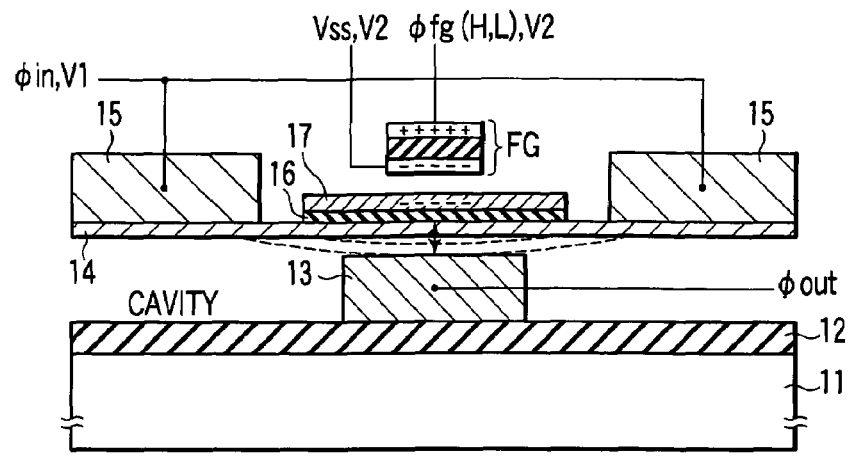
F I G. 4
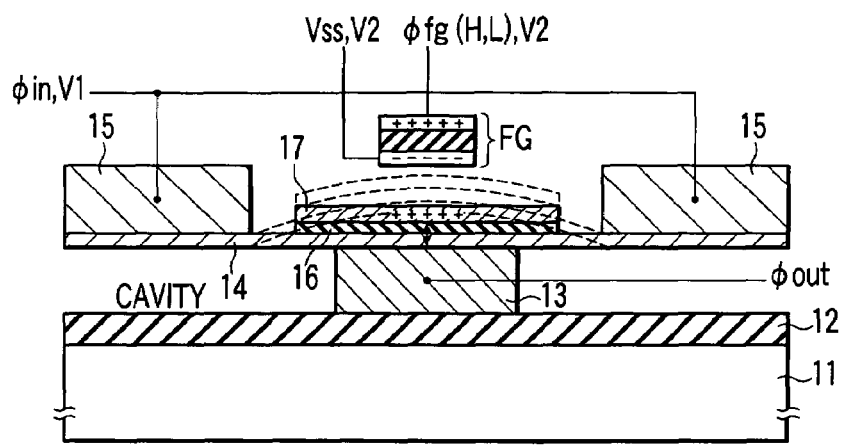
F I G. 5
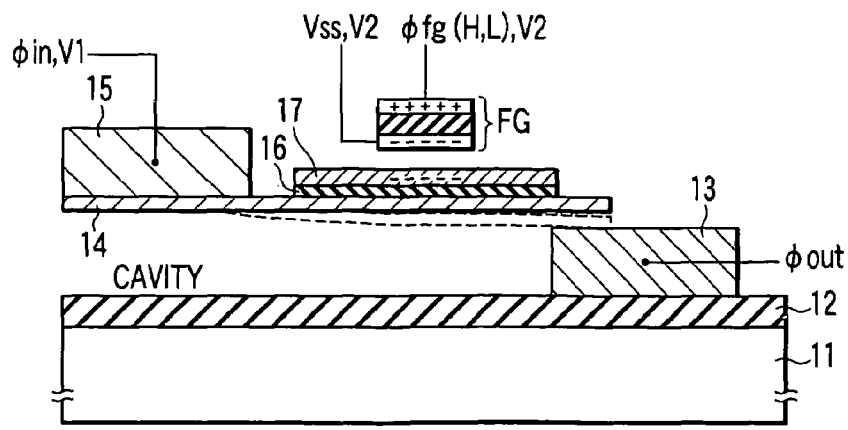
F I G. 6

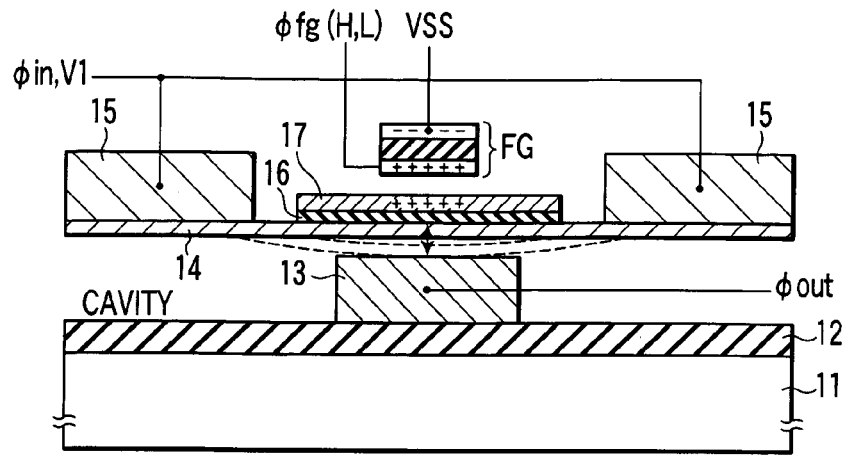
F I G. 7
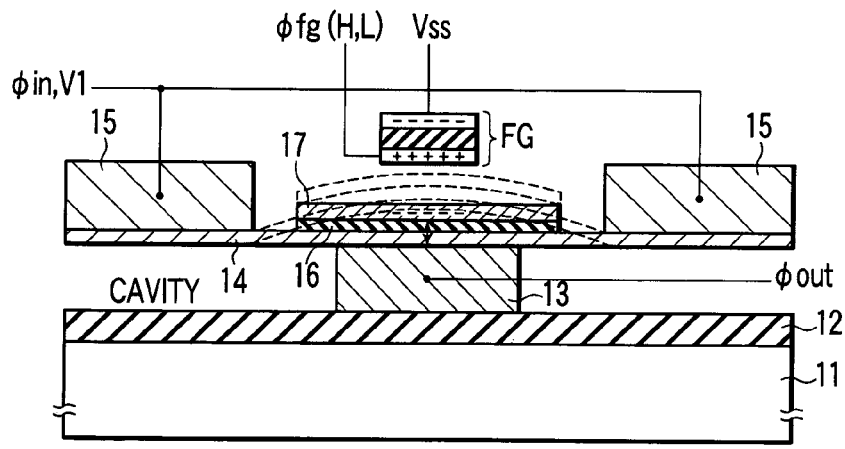
F I G. 8
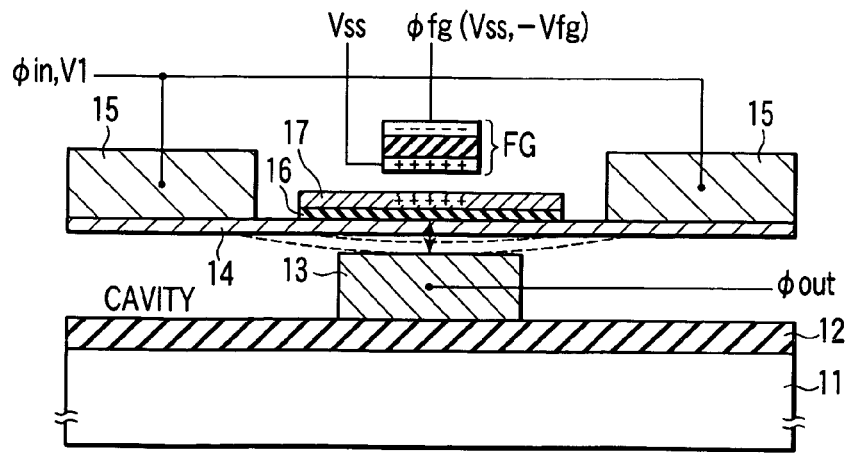
F I G. 9

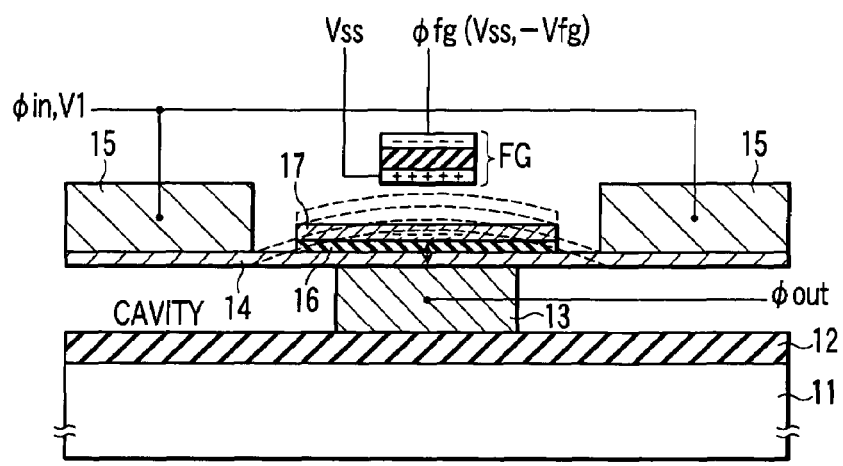
F I G. 10
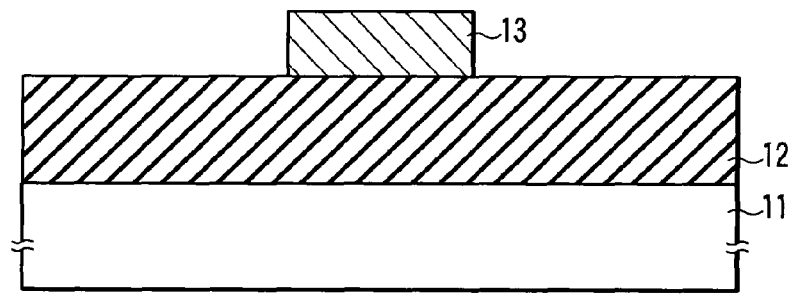
F I G. 11
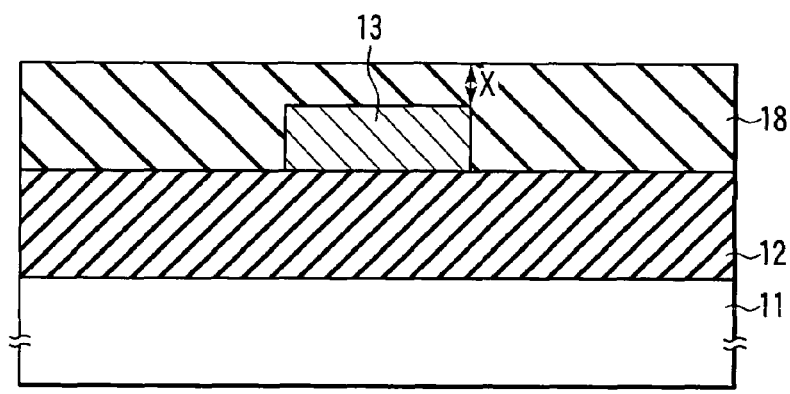
F I G. 12

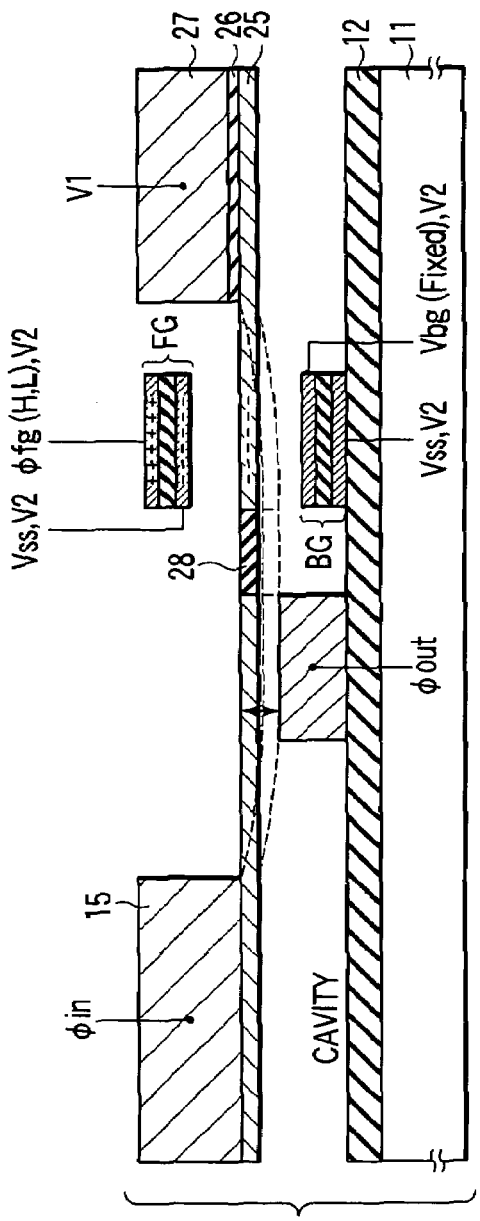
F I G. 22
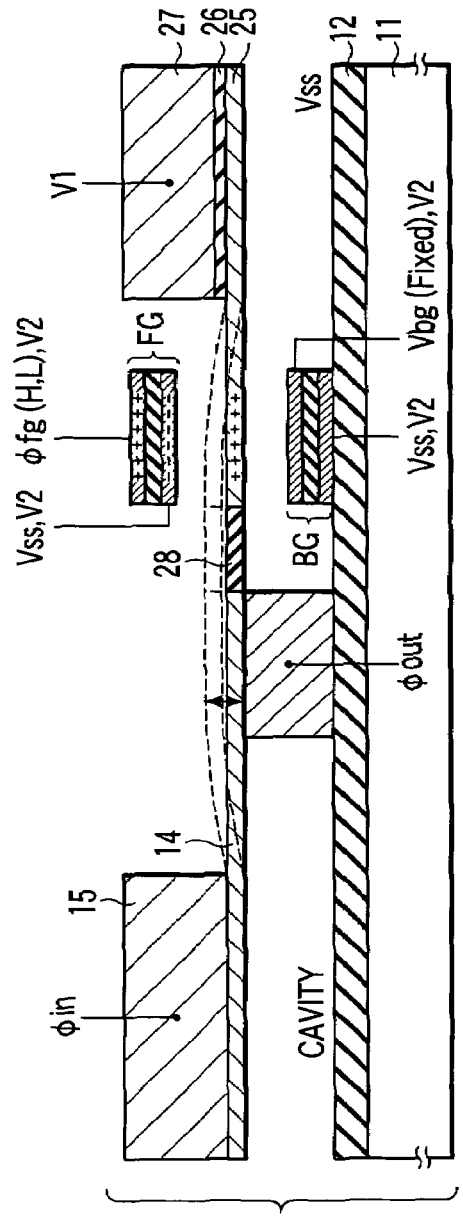
F I G. 23

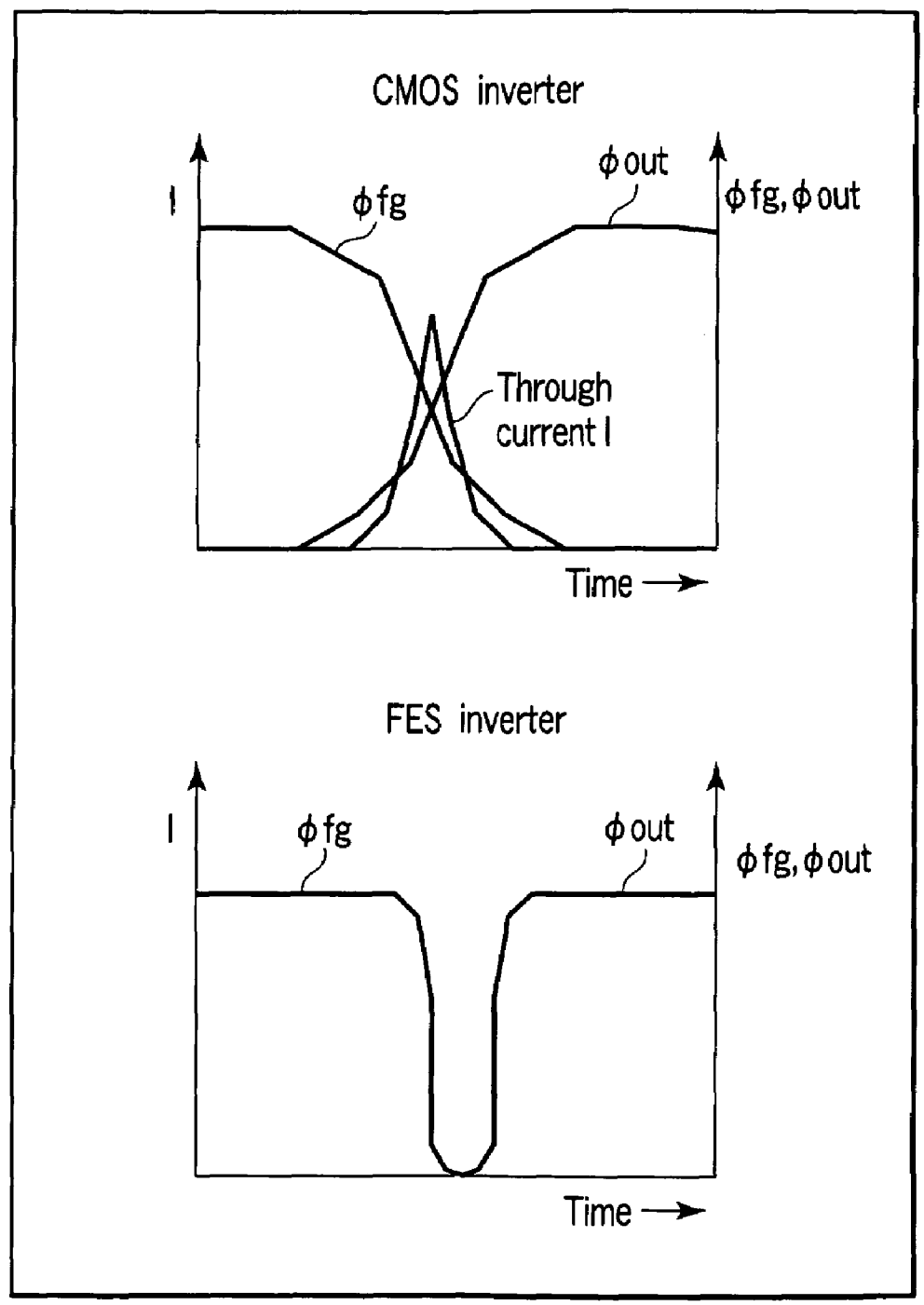
F I G. 2 8

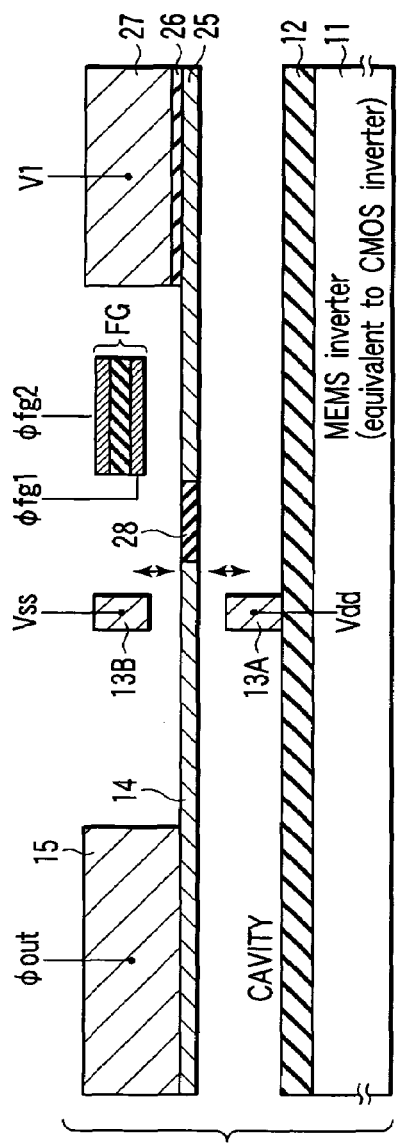
F I G. 32
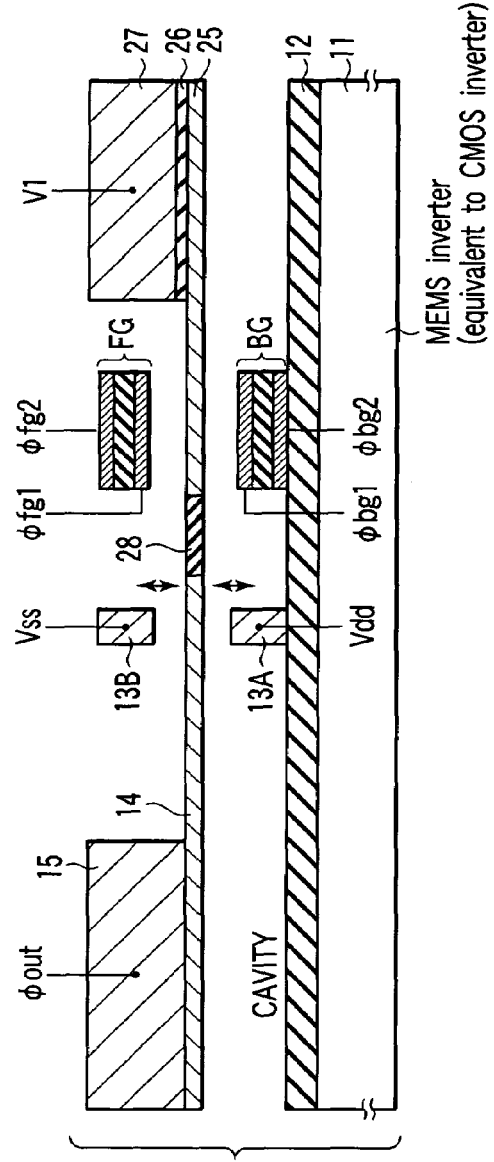
F I G. 33

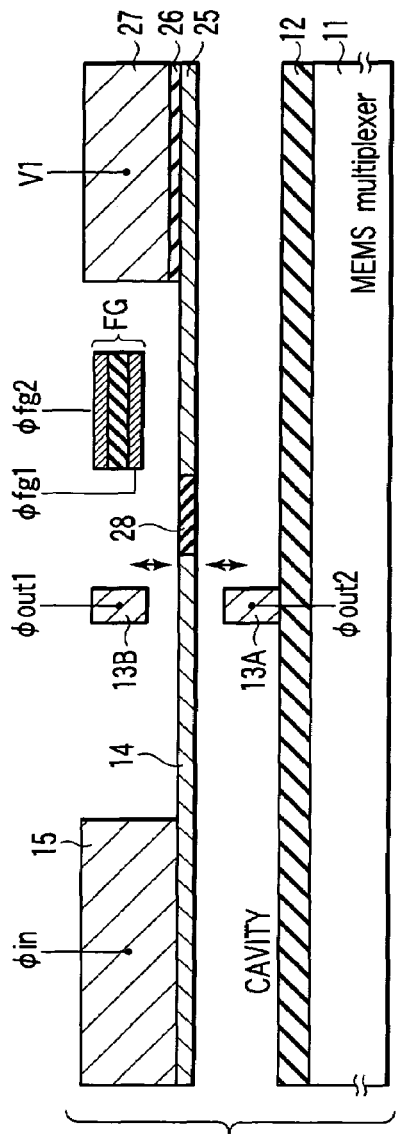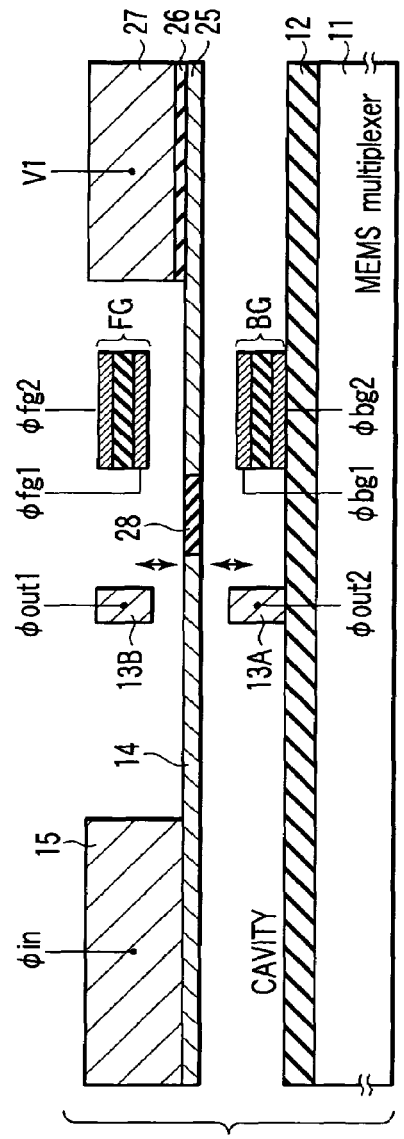
FIG.34
FIG.35

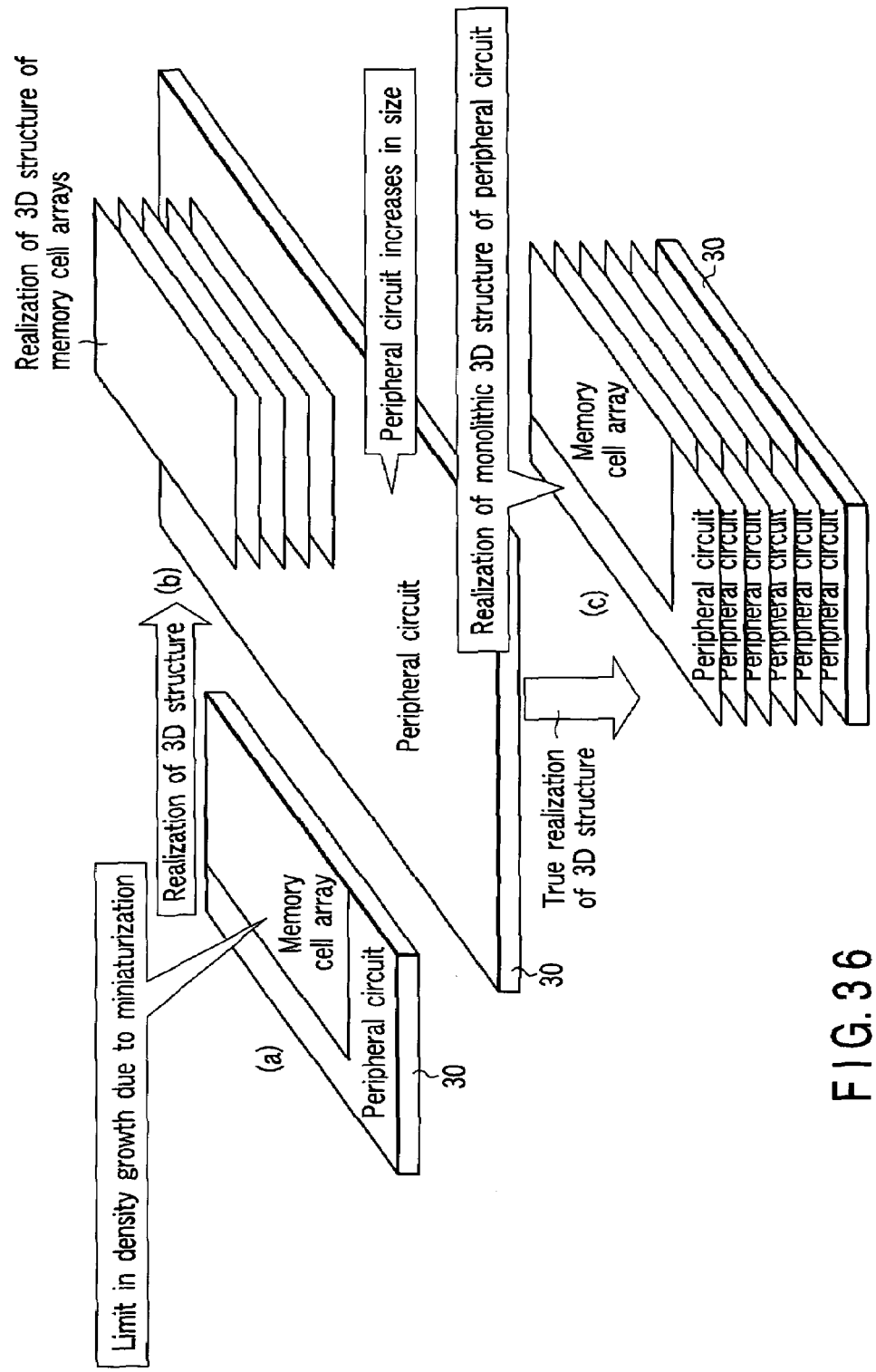
F I G. 36

SWITCHING ELEMENT

CROSS-REFERENCE TO RELATED APPLICATIONS

This application is based upon and claims the benefit of priority from prior Japanese Patent Application No. 2005-137411, filed May 10, 2005, the entire contents of which are incorporated herein by reference.

BACKGROUND OF THE INVENTION

1. Field of the Invention

The present invention relates to a switching element for use in an integrated circuit.

2. Description of the Related Art

An improvement in an arithmetic capacity of an integrated circuit is realized by an increase in a switching speed of transistors and an increase in the number of transistors in a chip. However, it is considered that miniaturization of transistors using silicon which is a key technology for realizing the improved arithmetic capacity will reach its limit in the near future.

Consequentially, in order to continuously develop the improvement in the arithmetic capacity of the integrated circuit, there have been investigated (A) development of transistors using a material other than silicon and (B) superimposition of transistors (realization of a three-dimension structure).

As to the former (A), transistors using carbon nanotubes, semiconductor nanowires or organic molecules has already been proposed, but there remain many problems to be solved.

For example, in regard to the carbon nanotubes, it is hard to regularly arrange them, and a process yield cannot be improved. Further, in case of transistors using a material other than the carbon nanotubes, a switching speed itself is lower than that of transistors using silicon.

As to the latter (B), it is hard to constitute multiple layers of silicon required to form transistors. Although a technology which realizes a three-dimensional structure by bonding a plurality of silicon substrates has been proposed, adopting this technology results in an increase in a cost.

BRIEF SUMMARY OF THE INVENTION

A switching element according to an aspect of the present invention comprises: a first input/output electrode; a movable portion which repeats contact/non-contact with respect to the first input/output electrode; a second input/output electrode connected with the movable portion; a floating gate electrode which is coupled with the movable portion through an insulating layer and in which electric charge is stored; and a first gate electrode which generates an electrostatic force between itself and the floating gate electrode to control an operation of the movable portion.

An FES inverter according to an aspect of the present invention comprises: a first switch comprising the switching element; and a second switch which is connected with the first switch in series and comprises the switching element.

An FES-AND according to an aspect of the present invention comprises: first and second switches which are connected between a ground terminal and an output terminal in parallel and comprise the switching element; and third and fourth switches which are connected between a power supply terminal and the output terminal in series and comprise the switching element.

A logic element according to an aspect of the present invention comprises: a first electrode; a movable portion which repeats contact/non-contact with respect to the first electrode; a second electrode connected with the movable portion; a floating gate electrode which is coupled with the movable portion through an insulating layer and in which electric charge is stored; and a gate electrode which generates an electrostatic force between itself and the floating gate electrode to control an operation of the movable portion, wherein an input signal is respectively input to one of the first and second electrodes and the gate electrode, and an output signal is output from the other one of the first and second electrodes.

A logic element according to an aspect of the present invention comprises: a first electrode to which a first power supply potential is applied; a second electrode to which a second power supply potential different from the first power supply potential is applied; a movable portion which repeats contact/non-contact with respect to the first and second electrodes; an output electrode connected with the movable portion; a floating gate electrode which is coupled with the movable portion through an insulating layer and in which electric charge is stored; and a gate electrode which generates an electrostatic force between itself and the floating gate electrode to control an operation of the movable portion.

A logic element according to an aspect of the present invention comprises: first and second output electrodes; a movable portion which repeats contact/non-contact with respect to the first and second output electrodes; an input electrode connected with the movable portion; a floating gate electrode which is coupled with the movable portion through an insulating layer and in which electric charge is stored; and a gate electrode which generates an electrostatic force between itself and the floating gate electrode to control an operation of the movable portion.

A semiconductor memory according to an aspect of the present invention comprises a plurality of memory cell arrays and a plurality of peripheral circuits superimposed on a semiconductor substrate, wherein each of the plurality of peripheral circuits has the switching element.

A system LSI according to an aspect of the present invention comprises a plurality of circuit blocks superimposed on a semiconductor substrate, wherein at least one of the plurality of circuit blocks has the switching element.

BRIEF DESCRIPTION OF THE SEVERAL VIEWS OF THE DRAWING

FIG. 4 is a cross-sectional view taken along a line IV-IV in FIG. 3;

FIG. 5 is a cross-sectional view showing a mechanical element according to a second embodiment;

FIG. 6 is a cross-sectional view showing a mechanical element according to a third embodiment;

FIG. 7 is a cross-sectional view showing a mechanical element as a modification of the first embodiment;

FIG. 8 is a cross-sectional view showing a mechanical element as a modification of the first embodiment;

FIG. 9 is a cross-sectional view showing a mechanical element as a modification of the first embodiment;

FIG. 10 is a cross-sectional view showing a mechanical element as a modification of the first embodiment;

FIG. 11 is a cross-sectional view showing a step of a manufacturing method;

FIG. 12 is a cross-sectional view showing a step of the manufacturing method;

FIG. 22 is a cross-sectional view showing a mechanical element as a modification of the fifth embodiment;

FIG. 23 is a cross-sectional view showing a mechanical element as a modification of the sixth embodiment;

FIG. 28 is a view showing a through current;

FIG. 32 is a circuit diagram showing MEMS inverter;

FIG. 33 is a circuit diagram showing MEMS inverter;

FIG. 34 is a circuit diagram showing MEMS multiplexer;

FIG. 35 is a circuit diagram showing MEMS multiplexer;

FIG. 36 is a view showing an example of realization of a three-dimensional structure of a semiconductor memory;

DETAILED DESCRIPTION OF THE INVENTION

A switching element of embodiments of the present invention will be described below in detail with reference to the accompanying drawings.

1. Overview

In an aspect of the present invention, a part or all of a switching element constituting an integrated circuit comprises a mechanical element having a movable portion (an actuator) in order to realize both an increase in a speed and a three-dimensional structure in the integrated circuit.

Although a technology which finely manufactures a mechanical element on a semiconductor substrate by utilizing a semiconductor processing technology is known as MEMS (micro electro mechanical systems) technology, a technology which achieves an increase in a speed and a three-dimensional structure of an integrated circuit when using a mechanical element in a logic circuit will be proposed here.

2. REFERENCE EXAMPLES

Figure 1:
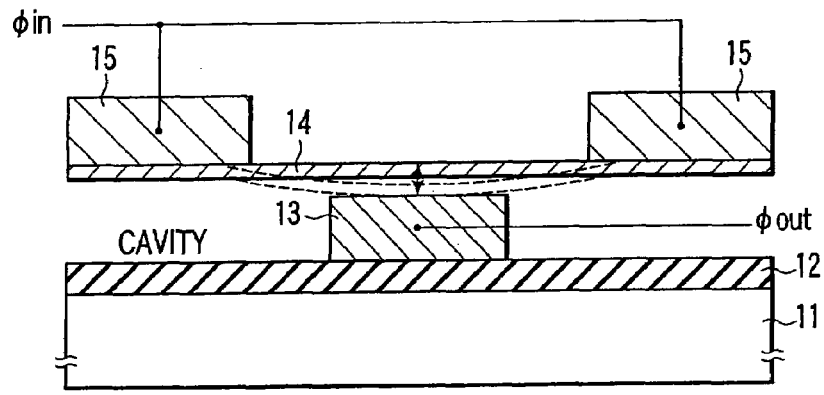
FIG. 1 is a cross-sectional view showing a mechanical element as a reference example.

FIG. 1 shows a first example of a mechanical element which functions as a switch.

An output electrode 13 is formed on an insulating layer 12 on a semiconductor substrate 11. A movable portion 14 is formed above the output electrode 13. A region between the insulating layer 12 and the movable portion 14 is a cavity. Input electrodes 15 are formed on the movable portion 14.

The movable portion 14 is of a doubly-supported beam type and formed of a material having both elasticity and tenacity, e.g., a material containing carbon such as a carbon nanotube.

An input signal $\phi in$ includes a control signal and transfer data. An on/off switching operation of the switch is controlled by supplying the input signal $\phi in$ as a control signal to the input electrodes 15 to generate an electrostatic attraction between the output electrode 13 and the movable portion 14. A state in which the movable portion 14 is in contact with the output electrode 13 is an ON state.

After the switch is turned on, the input signal $\phi in$ as transfer data is transferred from the input electrodes 15 to the output electrode 13. The transfer data is, e.g., binary data.

Figure 2:
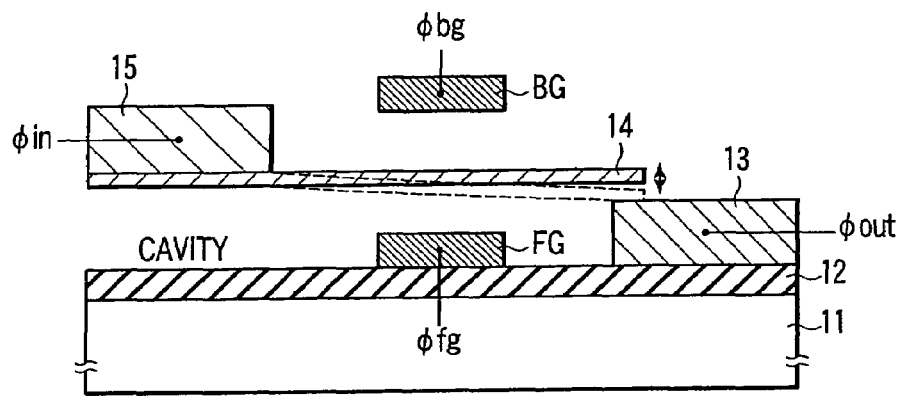
FIG. 2 is a cross-sectional view showing a mechanical element as a reference example.

FIG. 2 shows a second example of the mechanical element which functions as the switch.

An output electrode 13 is formed on an insulating layer 12 on a semiconductor substrate 11. A movable portion 14 is formed above the output electrode 13. A region between the insulating layer 12 and the movable portion 14 is a cavity. An input electrode 15 is formed on the movable portion 14.

The movable portion 14 is of a cantilever type, and formed of, e.g., a material containing carbon such as a carbon nanotube like the first example.

The movable portion 14 is sandwiched between a forward gate electrode FG and a back gate electrode BG. A control signal $\phi fg$ is supplied to the forward gate electrode FG, and a control signal $\phi bg$ is supplied to the back gate electrode BG.

An on/off switching operation of the switch is controlled by, e.g., supplying the control signal $\phi fg$ to the forward gate electrode FG, fixing a potential of the control signal $\phi bg$ and generating an electrostatic attraction or an electrostatic repulsive force between the movable portion 14 and the forward electrode FG or between the movable portion 14 and the back gate electrode BG. A state in which the movable portion 14 is in contact with the output electrode 13 is an ON state.

After the switch is turned on, an input signal $\phi in$ as transfer data is transferred to the output electrode 13 from the input electrode 15. The transfer data is, e.g., binary data.

In any example, the electrostatic force is utilized to move the movable portion 14 so that the switch is controlled to be turned on/off. However, in these examples, the electrostatic force directly affects the movable portion 14 as a path for the transfer data.

In this case, it is hard to perform a stable operation in a logic circuit which simultaneously carries out an on/off switching operation of the switch and transfer of the transfer data since a threshold value of the switch fluctuates depending on a value of the transfer data.

3. Embodiments

Some embodiments which are considered as the best will now be described hereinafter.

In the following embodiments, there is proposed a switching element which enables a high-speed operation and a realization of a three-dimensional structure and does not jeopardizes a stable operation even when used in a logic circuit.

(1) First Embodiment

Figure 3:
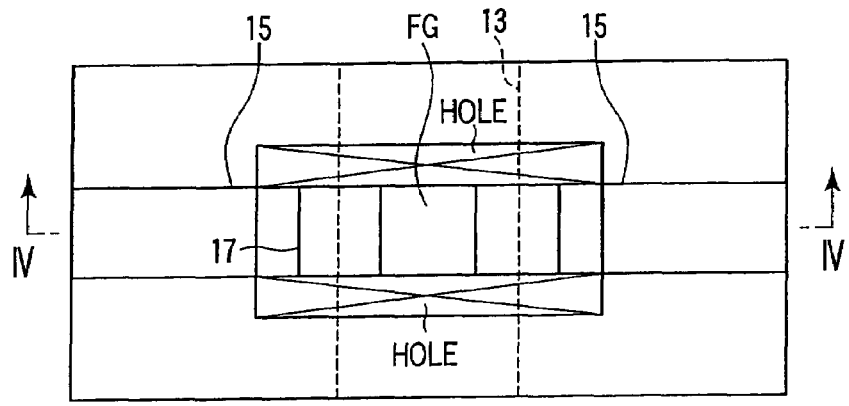
FIG. 3 is a plane view showing a mechanical element according to a first embodiment.

FIG. 3 shows a mechanical element as a first embodiment. FIG. 4 is a cross-sectional view taken along a line IV-IV in FIG. 3.

This mechanical element functions as a normally-OFF type switch.

An output electrode 13 is formed on an insulating layer 12 on a semiconductor substrate 11. A movable portion 14 is formed above the output electrode 13. A region between the insulating layer 12 and the movable portion 14 is a cavity. A hole HOLE forms the cavity and allows movement of the movable portion 14.

The movable portion 14 is of a doubly-supported beam type, and formed of a material having both elasticity and tenacity, e.g., a material containing carbon such as a carbon nanotube. Since an Si-based material such as SiN often used for a MEMS element has a large elastic constant, a voltage which is not less than several-ten V is required to drive this material with an electrostatic force. However, since an elastic constant of a carbon-based material such as a carbon nanotube is two- or three-digit smaller than the former, this material can be driven by using a low voltage. In case of forming the movable portion 14 of carbon nanotubes, the movable portion 14 is a bundle of carbon nanotubes which are regularly arranged. In case of the doubly-supported beam, there are characteristics that the movable portion 14 and the electrode 13 can stably obtain a contact point.

A floating gate electrode 17 is formed on the movable portion 14 through an insulating layer 16. A forward gate electrode FG is formed above the floating gate electrode 17.

The forward gate electrode FG comprises, e.g., a capacitor. A fixed potential (e.g., a ground potential) Vss is supplied to a lower electrode of this capacitor on the floating gate electrode 17 side, and a control signal $\phi fg$ is input to an upper electrode of the same.

The floating gate electrode 17 is a member which generates an electrostatic force between itself and the forward gate electrode FG, and electric charge is stored in the floating gate electrode 17. In this example, negative electric charge (electrons) is stored in the floating gate electrode 17.

Electrons can be readily injected into the floating gate electrode 17 by, e.g., giving a potential V1 to the input electrodes 15 and giving a potential V2 (>V1) to the two electrodes of the capacitor as the forward gate electrode FG. Here, the insulating layer 16 is formed sufficiently thin in order to facilitate tunneling of the electrons.

A threshold value of the switch can be adjusted based on a quantity of electric charge (electrons) stored in the floating gate electrode 17.

The switch is turned on/off by, e.g., supplying a control signal $\phi fg$ to the upper electrode of the capacitor as a forward gate electrode FG. The lower electrode of the capacitor is fixed to the fixed potential Vss.

When the control signal $\phi fg$ is "H", e.g., Vdd (>Vss), negative electric charge is stored in the lower electrode of the capacitor. As a result, an electrostatic repulsive force is generated between the forward gate electrode FG and the floating gate electrode 17, and the movable portion 14 is elastically deformed to come into contact with the output electrode 13, thereby turning on the switch.

When the switch is turned on, an input signal $\phi in$ as transfer data is transferred to the output electrode 13 from the input electrodes 15, and output as an output signal $\phi out$. The transfer data is, e.g., binary data ("H" or "L").

When the control signal $\phi fg$ is changed to "L", e.g., Vss, the negative electric charge stored in the lower electrode of the capacitor is lost. As a result, the electrostatic repulsive force between the forward gate electrode FG and the floating gate electrode 17 is not generated, and the movable portion 14 moves away from the output electrode 13 by an elastic force thereof to return to its original state, thereby turning off the switch.

Such a mechanical element is equivalent to an N channel MOS transistor using silicon. That is, the mechanical element is turned on when the control signal $\phi fg$ is "H", and it is turned off when this signal is "L". Since the element can be manufactured by using the same lithography and etching as those in an MOS transistor manufacturing process, a dimension of the element is substantially close to that of an MOS transistor. Since a single-crystal substrate does not have to be used, a multi-layer can be readily formed by repeating the same process. Therefore, substituting the N channel MOS transistor for this mechanical element to achieve an increase in a speed and a three-dimensional structure of an integrated circuit.

Further, according to this mechanical element, the electrostatic force is generated between the forward gate electrode FG and the floating gate electrode 17, and it does not affect the movable portion 14 which is a path for the transfer data. Therefore, even if this mechanical element is applied to a logic circuit which simultaneously performs an on/off switching operation of the switch and transfer of the transfer data, a threshold value of the switch hardly fluctuates, thereby enabling a stable operation.

It is to be noted that setting a quantity of the electric charge stored in the floating gate electrode 17 to be sufficiently larger than a signal quantity of the transfer data enables a further stable operation.

(2) Second Embodiment

FIG. 5 shows a mechanical element as a second embodiment. A plan view is the same as the first embodiment, i.e., FIG. 3.

This mechanical element functions as a normally-ON type switch.

An output electrode 13 is formed on an insulating layer 12 on a semiconductor substrate 11. A movable portion 14 is formed on the output electrode 13. The movable portion 14 is in contact with the output electrode 13 but not physically coupled with the same. A region between the insulating layer 12 and the movable portion 14 is a cavity. Input electrodes 15 are formed on the movable portion 14.

The movable portion 14 is of a doubly-supported beam type, and formed of a material containing carbon such as a carbon nanotube like the first embodiment. In case of forming the movable portion 14 by using carbon nanotubes, the movable portion 14 is a bundle of the carbon nanotubes which are regularly arranged.

A floating gate electrode 17 is formed on the movable portion 14 through an insulating layer 16. A forward gate electrode FG is formed above the floating gate electrode 17.

The forward gate electrode FG comprises, e.g., a capacitor. A fixed potential (e.g., a ground potential) Vss is given to a lower electrode of the capacitor on the floating gate electrode 17 side, and a control signal φfg is input to an upper electrode of the same.

The floating gate electrode 17 is a member which generates an electrostatic force between itself and the forward gate electrode FG, and electric charge is stored in the floating gate electrode 17. In this example, positive electric charge (holes) is stored in the floating gate electrode 17.

The holes can be easily injected into the floating gate electrode 17 by, e.g., giving a potential V1 to the input electrodes 15 and giving a potential V2 (<V1) to the two electrodes of the capacitor as the forward gate electrode FG. Here, the insulating layer 16 is formed sufficiently thin in order to facilitate tunneling of electrons.

A threshold value of the switch can be adjusted based on a quantity of the electric charge (the holes) stored in the floating gate electrode 17.

The switch is turned on/off by supplying, e.g., the control signal φfg to the upper electrode of the capacitor as the forward gate electrode FG. The lower electrode of the capacitor is fixed at the fixed potential Vss.

When the control signal φfg is "H", e.g., Vdd (>Vss), negative electric charge is stored in the lower electrode of the capacitor. As a result, an electrostatic attraction is generated between the forward gate electrode FG and the floating gate electrode 17, and the movable portion 14 is elastically deformed to move away from the output electrode 13, thereby turning off the switch.

When the control signal φfg is "L", e.g., Vss, the negative electric charge stored in the lower electrode of the capacitor is lost. As a result, the electrostatic attraction between the forward gate electrode FG and the floating gate electrode 17 is not generated, and the movable portion 14 returns to its original state by an elastic force thereof and comes into contact with the output electrode 13, thereby turning on the switch.

When the switch is turned on, an input signal φin as transfer data is transferred from the input electrodes 15 to the output electrode 13, and output as an output signal φout. The transfer data is, e.g., binary data ("H" or "L").

Such a mechanical element is equivalent to a P channel MOS transistor using silicon. That is, since the mechanical element is turned off when the control signal φfg is "H" and it is turned on when this signal is "L", substituting the P channel MOS transistor for this mechanical element can achieve an increase in a speed and a three-dimensional structure of an integrated circuit.

Further, according to this mechanical element, an electrostatic force is generated between the forward gate electrode FG and the floating gate electrode 17, and it does not affect the movable portion 14 as a path for transfer data. Therefore, even if this mechanical element is applied to a logic circuit which simultaneously performs an on/off switching operation of the switch and transfer of transfer data, a threshold value of the switch hardly fluctuates and a stable operation is possible.

It is to be noted that setting a quantity of electric charge stored in the floating gate electrode 17 to be sufficiently larger than a signal quantity of transfer data enables a further stable operation.

(3) Third Embodiment

FIG. 3 shows a mechanical element as a third embodiment. A plan view is the same as the first embodiment, i.e., FIG. 3.

This mechanical element functions as a normally-OFF type switch.

An output electrode 13 is formed on an insulating layer 12 on a semiconductor substrate 11. A movable portion 14 is formed above the output electrode 13. A region between the insulating layer 12 and the movable portion 14 is a cavity. An input electrode 15 is formed on the movable portion 14.

The movable portion 14 is of a cantilever type, and formed of a material having both elasticity and tenacity, e.g., a material containing carbon such as a carbon nanotube. In case of forming the movable portion 14 by using the carbon nanotubes, the movable portion 14 is a bundle of the carbon nanotubes which are regularly arranged.

A floating gate electrode 17 is formed on the movable portion 14 through an insulating layer 16. A forward gate electrode FG is formed above the floating gate electrode 17.

The forward gate electrode FG comprises, e.g., a capacitor. A fixed potential (e.g., a ground potential) Vss is given to a lower electrode of this capacitor on the floating gate electrode 17 side, and a control signal φfg is input to an upper electrode of the same.

The floating gate electrode 17 is a member which generates an electrostatic force between itself and the forward gate electrode FG, and electric charge is stored in the floating gate electrode 17. In this example, negative electric charge (electrons) is stored in the floating gate electrode 17.

The electrons can be readily injected into the floating gate electrode 17 by, e.g., giving a potential V1 to the input electrode 15 and giving a potential V2 (>V1) to the two electrodes of the capacitor as the forward gate electrode FG. Here, the insulating layer 16 is formed sufficiently thin in order to facilitate tunneling of the electrons.

A threshold value of the switch can be adjusted based on a quantity of the electric charge (the electrons) stored in the floating gate electrode 17.

Since an on/off operation of the switch is the same as that in the first embodiment, its explanation is eliminated here.

Since such a mechanical element is equivalent to an N channel MOS transistor using silicon like the first embodiment, substituting the N channel MOS transistor for the mechanical element can achieve an increase in speed and a three-dimensional structure of an integrated circuit.

Moreover, in this mechanical element, an electrostatic force is generated between the forward gate electrode FG and the floating gate electrode 17, and it does not affect the movable portion 14 as a path for transfer data. Therefore, even if this mechanical element is applied to a logic circuit which simultaneously performs an on/off switching operation of the switch and transfer of transfer data, the threshold value of the switch hardly fluctuates, and a stable operation is possible.

It is to be noted that setting a quantity of the electric charge stored in the floating gate electrode 17 to be sufficiently larger than a signal quantity of transfer data enables a further stable operation.

(4) Modifications

In the first to third embodiments, the electric charge to be stored in the floating gate electrode may be either positive or negative.

In any case, this mechanical element can be used as a switch by modifying the control signal φfg or a configuration of the capacitor as the forward gate electrode.

For instance, in an example illustrated in FIG. 7, positive electric charge (holes) is stored in a floating gate electrode 17 of the mechanical element according to the first embodiment. In this case, a control signal φfg is supplied to a lower electrode of a capacitor as a forward gate electrode FG, and an upper electrode of the capacitor is fixed at a fixed potential Vss.

In an example depicted in FIG. 8, negative electric charge (electrons) is stored in a floating gate electrode 17 of the mechanical element according to the second embodiment. In this case, for example, a control signal φfg is supplied to a lower electrode of a capacitor as a forward gate electrode FG, and an upper electrode of the capacitor is fixed at a fixed potential Vss.

In an example shown in FIG. 9, positive electric charge (holes) is stored in a floating gate electrode 17 of the mechanical element according to the first embodiment. In this case, for example, a control signal φfg is supplied to an upper electrode of a capacitor as a forward gate electrode FG, and a lower electrode of the capacitor is fixed at a fixed potential Vss. However, the control signal φfg has two values, i.e., Vss (0 V) and −Vfg (a negative potential).

In an example shown in FIG. 10, negative electric charge (electrons) is stored in a floating gate electrode 17 of the mechanical element according to the second embodiment. In this case, for example, a control signal φfg is supplied to an upper electrode of a capacitor as a forward gate electrode FG, and a lower electrode of the capacitor is fixed at a fixed potential Vss. However, the control signal φfg has two values, i.e., Vss (0 V) and −Vfg (a negative potential).

(5) Manufacturing Method

A manufacturing method of a switching element according to an example of the present invention will now be described.

The mechanical element according to the first embodiment will be taken as an example here.

First, as shown in FIG. 11, an insulating layer (e.g., silicon oxide) 12 having a thickness of approximately 1.0 μm is formed on a semiconductor substrate 11 by using a thermal oxidation method.

Additionally, an electroconductive layer (e.g., a metal such as Cu or Pt) 13 having a thickness of approximately 10 nm is formed on the insulating layer 12 by using a sputtering method. A PEP (photo engraving process) is used to form a resist pattern, and the electroconductive layer 13 is etched by RIE (reactive ion etching) with this resist pattern being used as a mask. The electroconductive layer 13 is formed into a square shape of, e.g., 100 nm×100 nm by this etching, and this is determined as an output electrode. Then, the resist pattern is removed.

Thereafter, as shown in FIG. 12, a dummy layer (e.g., $Al_2O_3$) 18 which completely covers the electroconductive layer 13 as the output electrode is formed on the insulating layer 12 by using a CVD (chemical vapor deposition) method. Then, the dummy layer 18 is polished by using a method such as CMP (chemical mechanical polishing) or etching back so that a surface of the dummy layer 18 is flattened.

Here, a distance X from an upper surface of the electroconductive layer 13 to an upper surface of the dummy layer 18 is set to, e.g., approximately 10 nm.

Figure 13:
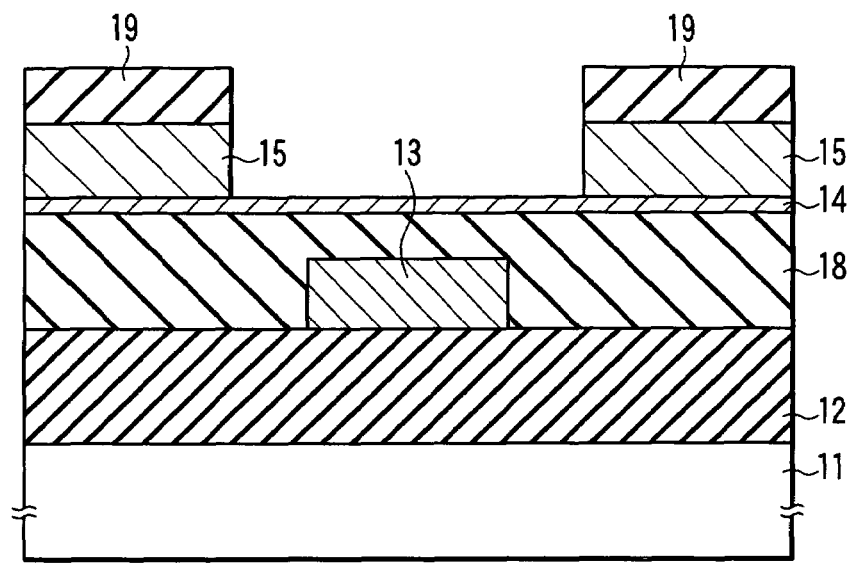
FIG. 13 is a cross-sectional view showing a step of the manufacturing method.

Then, as shown in FIG. 13, a carbon nanotube layer 14 as a movable portion is formed on the dummy layer 18. The carbon nanotube layer 14 is formed in such a manner that bundles of carbon nanotubes are regularly arranged, and a thickness of the carbon nanotube layer 14 is determined taking elasticity and tenacity into consideration.

Further, an electroconductive layer (e.g., a metal such as Cu or Pt) 15 having a thickness of, e.g., approximately 10 nm is formed on the carbon nanotube layer 14 by using the sputtering method. A resist pattern 19 is formed by PEP, and the electroconductive layer 15 is etched by RIE with this resist pattern 19 being used as a mask. The electroconductive layer 15 is formed into a square shape of, e.g., 100 nm×100 nm by this etching, and this is determined as an input electrode. Then, this resist pattern 19 is removed.

Furthermore, a hole is formed into the carbon nanotube layer 14 by a lithography process and an etching process.

Figure 14:
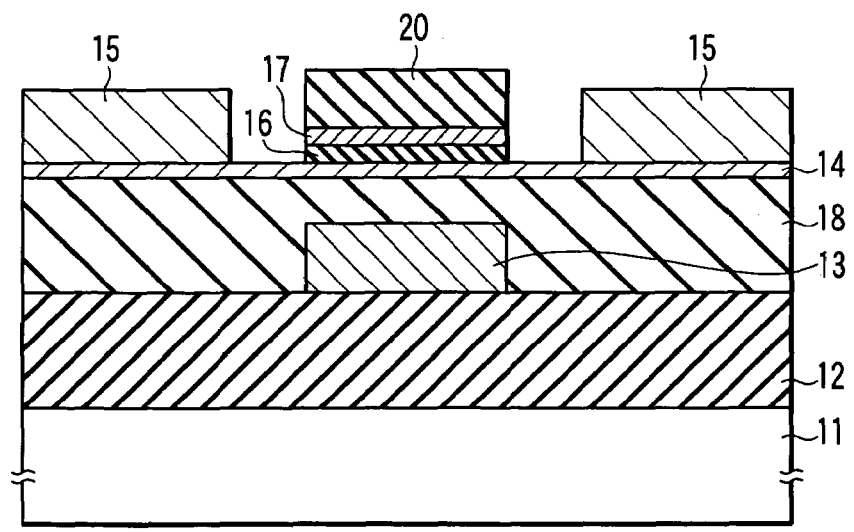
FIG. 14 is a cross-sectional view showing a step of the manufacturing method.

Subsequently, as shown in FIG. 14, an insulating layer (e.g., silicon oxide) 16 having a thickness of, e.g., approximately 1 nm is formed on the carbon nanotube layer 14 by using the CVD method, and then an electric charge storage layer (e.g., carbon nanotubes) 17 having a thickness of approximately 1 nm is formed on the insulating layer 16.

Thereafter, a resist pattern 20 is formed by the PEP, and the electric charge storage layer 17 and the insulating layer 16 are etched by the RIE with this resist pattern 20 being used as a mask. The electric charge storage layer 17 is formed into a square shape of, e.g., 100 nm×100 nm by this etching, and it is determined as a floating gate electrode. Thereafter, the resist pattern 20 is removed.

Figure 15:
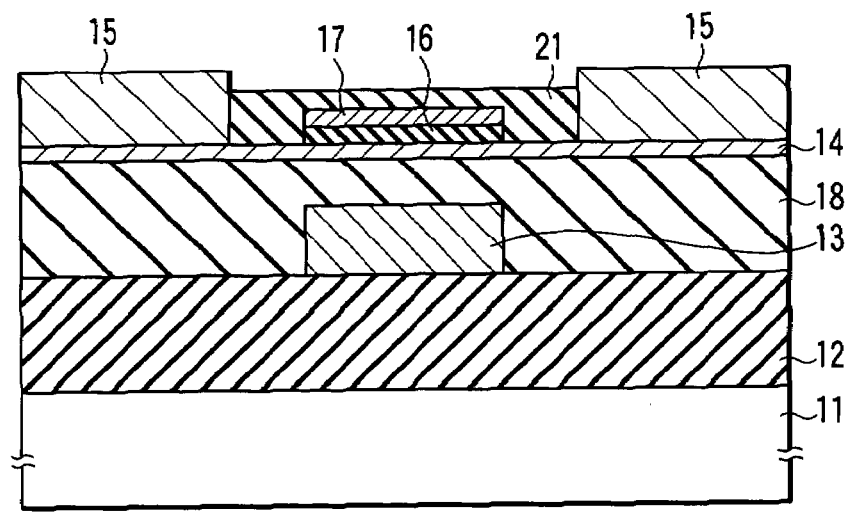
FIG. 15 is a cross-sectional view showing a step of the manufacturing method.

Then, as shown in FIG. 15, a dummy layer (e.g., $Al_2O_3$) 21 which completely covers the electric charge storage layer 17 as the floating gate electrode is formed on the carbon nanotube layer 14 by using the CVD method. Subsequently, the dummy layer 21 is polished by using a method such as CMP or etching back so that the dummy layer 21 remains around the electric charge storage layer 17 and a surface of the dummy layer 21 is flattened.

Figure 16:
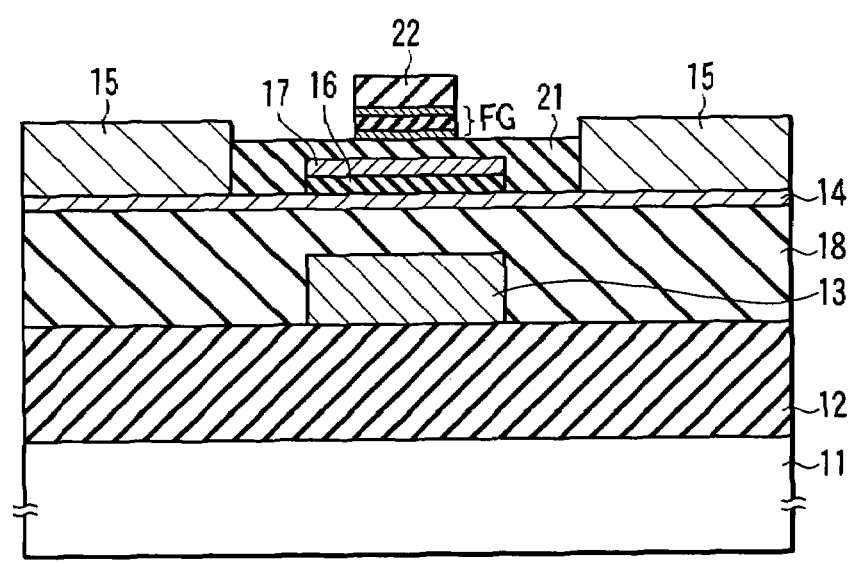
FIG. 16 is a cross-sectional view showing a step of the manufacturing method.

Then, as shown in FIG. 16, a forward gate electrode FG having a thickness of approximately 10 nm is formed on the dummy layer 21 on the electric charge storage layer 17.

The forward gate electrode FG is formed by, e.g., sequentially forming an electroconductive layer, an insulating layer and an electroconductive layer on the dummy layer 21 and then etching the electroconductive layer, the insulating layer and the electroconductive layer by the RIE with the resist pattern 22 being used as a mask. The forward gate electrode FG is formed into a square shape of, e.g., 50 nm×50 nm by this etching. Thereafter, the resist pattern 20 is removed.

Figure 17:
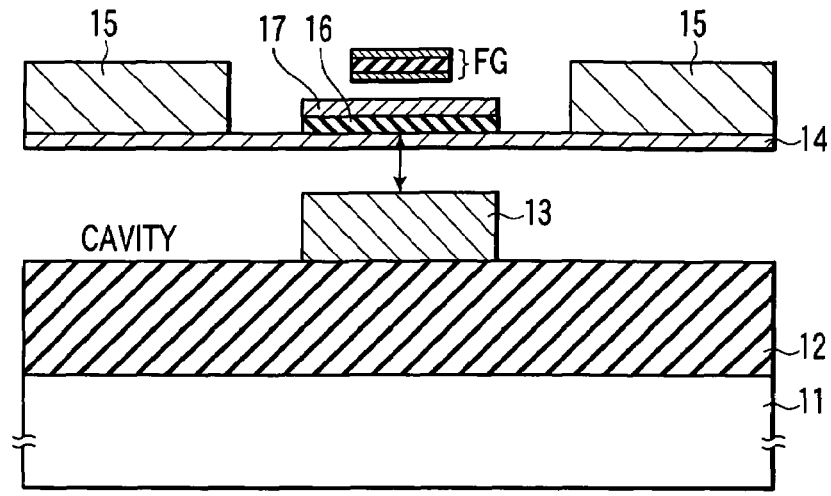
FIG. 17 is a cross-sectional view showing a step of the manufacturing method.

Then, as shown in FIG. 17, the dummy layers 18 and 21 are removed by using a chemical or a reactive gas to form a cavity which allows movement of the movable portion as an actuator. When the dummy layers 18 and 21 are formed of alumina ($Al_2O_3$), the dummy layers 18 and 21 are removed by using a chemical such as a hydrochloric acid.

With the above-described steps, the switching element according to the first embodiment is brought to completion.

It is to be noted that, in the above-described manufacturing method, as a material constituting the dummy layers 18 and 21 used for forming the cavity, it is possible to use a silicon material such as polysilicon or amorphous silicon or an organic material such as resist besides $Al_2O_3$.

In case of using resist as the dummy layers 18 and 21, the dummy layers 18 and 21 can be removed by a vaporization method called ashing.

As to removable of the dummy layers 18 and 21, the dummy layers 18 and 21 may be collectively removed like this example, or the dummy layers 18 and 21 may be separately removed.

(6) Fourth Embodiment

In a fourth embodiment, a shield electrode is arranged between a floating gate electrode storing electric charge which generates an electrostatic force and a movable portion in order to completely eliminate an influence of the electrostatic force with respect to the movable portion as a transfer path for transfer data.

Figure 18:
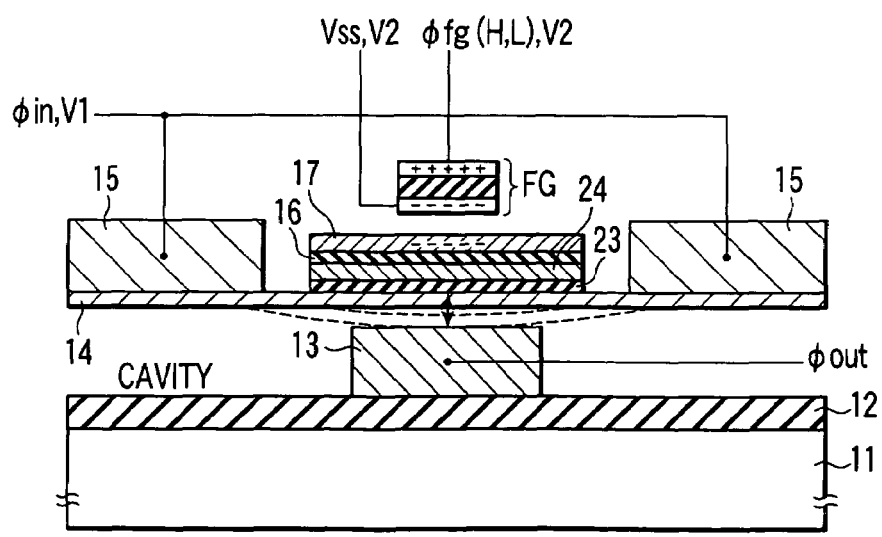
FIG. 18 is a cross-sectional view showing a mechanical element according to a fourth embodiment.
Figure 19:
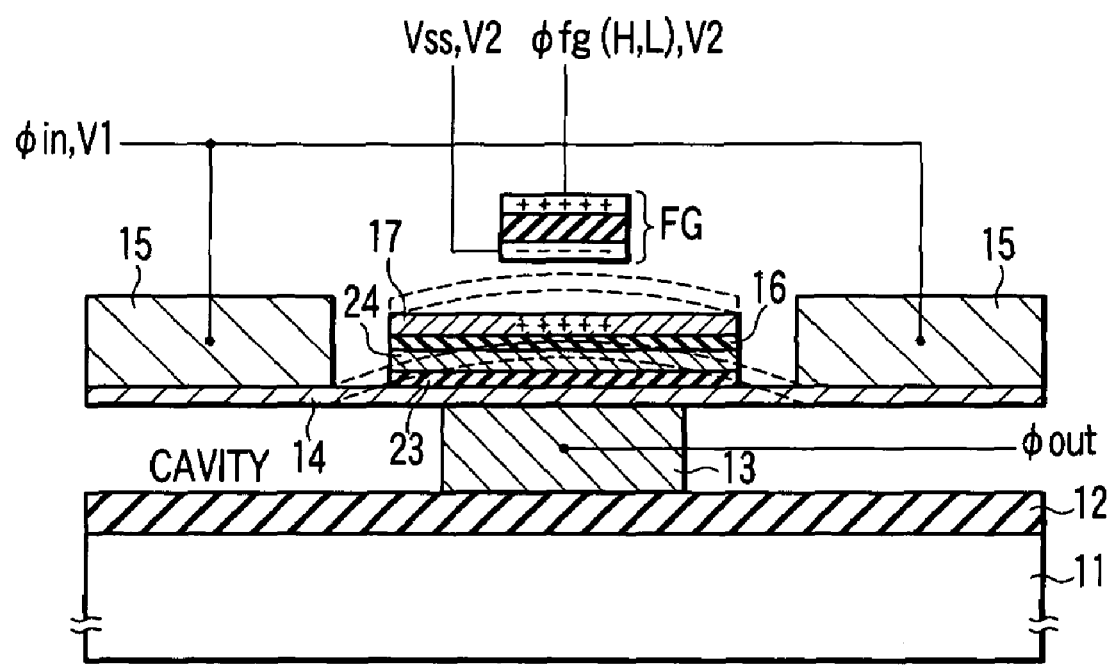
FIG. 19 is a cross-sectional view showing a mechanical element according to the fourth embodiment.

FIGS. 18 and 19 show mechanical elements according to the fourth embodiment.

FIG. 18 corresponds to an improved example of the mechanical element of FIG. 4 as the first embodiment, and FIG. 19 corresponds to an improved example of the mechanical element of FIG. 5 as the second embodiment.

The fourth embodiment is different from the first and second embodiments in that an insulating layer (e.g., silicon oxide) 23 is arranged on a movable portion 14 and a shield layer (e.g., carbon nanotubes) 24 is arranged on the insulating layer 23. An insulating layer 16 and a floating gate electrode 17 are arranged on the shield layer 24.

Since any other structures are the same as those in the first and second embodiments, their explanation will be eliminated here.

It is to be noted that electric charge stored in the floating gate electrode 17 may be either positive or negative.

In the mechanical element according to the fourth embodiment, the mechanical element can likewise substitute for an N channel transistor or a P channel transistor, it is possible to achieve an increase in a speed or a three-dimensional structure of an integrated circuit.

Further, by newly providing the floating gate electrode 17 which generates an electrostatic force and the shield layer 24 which shields against the electrostatic force, a threshold value of the switch does not fluctuate, and a stable operation is possible.

(7) Fifth Embodiment

Figure 20:
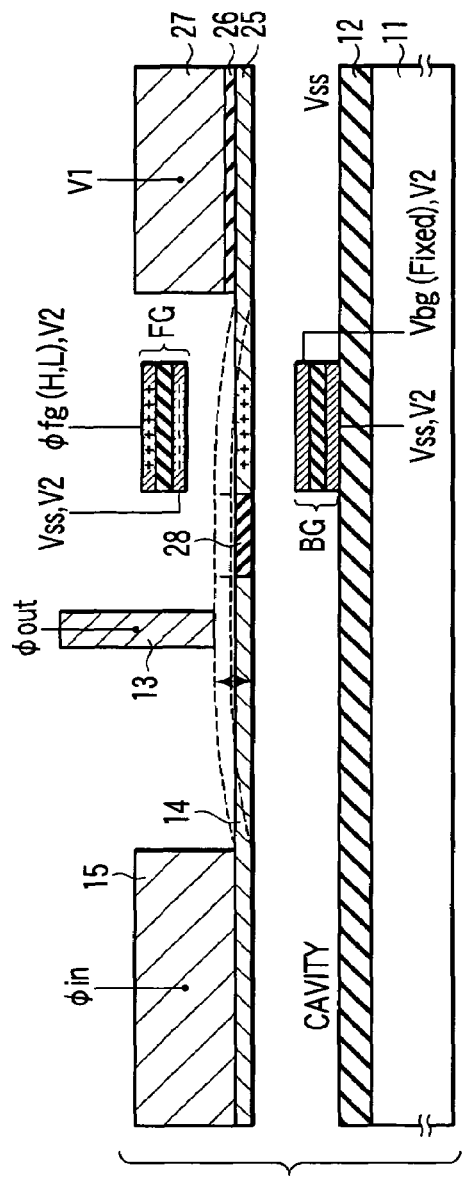
FIG. 20 is a cross-sectional view showing a mechanical element according to a fifth embodiment.

FIG. 20 shows a mechanical element as a fifth embodiment.

This mechanical element functions as a normally-OFF type switch.

A back gate electrode BG is formed on an insulating layer 12 of a semiconductor substrate 11. A movable portion 14 and a floating gate electrode 25 are formed above the back gate electrode BG. A region between the insulating layer 12 and the movable portion and between the insulating layer 12 and the floating gate electrode 25 is a cavity.

The back gate electrode BG comprises, e.g., a capacitor. A fixed potential Vbg is given to an upper electrode of this capacitor on the floating gate electrode 25 side, and a ground potential Vss is given to a lower electrode of the same.

The movable portion 14 and the floating gate electrode 25 are formed in the same layer, but they are electrically separated from each other by an insulating layer (e.g., silicon oxide) 28. However, the movable portion 14, the floating gate electrode 25 and the insulating layer 28 are physically coupled with each other, and hence they can move as one body.

The movable portion 14 and the floating gate electrode 25 are formed of a material having both elasticity and tenacity, e.g., a material containing carbon such as a carbon nanotube. In case of forming the movable portion 14 and the floating gate electrode 24 by using the carbon nanotubes, each of the movable portion 14 and the floating gate electrode 25 is a bundle of the carbon nanotubes which are regularly arranged.

An input electrode 15 is formed on the movable portion 14. Furthermore, an output electrode 13 is formed on the movable portion 14.

An electrode 27 for electric charge injection is formed on the floating gate electrode 25 through an insulating layer (e.g., silicon oxide) 26. A forward gate electrode FG is formed above the floating gate electrode 25.

The forward gate electrode FG comprises, e.g., a capacitor. A fixed potential (e.g., a ground potential) Vss is given to a lower electrode of this capacitor on the floating gate electrode 25 side, and a control signal φfg is input to an upper electrode of this capacitor.

The floating gate electrode 25 is a member which generates an electrostatic force between the forward gate electrode FG and the back gate electrode BG, and electric charge is stored in the floating gate electrode 25. In this example, positive electric charge (holes) is stored in the floating gate electrode 25.

The holes are injected into the floating gate electrode 25 by, e.g., giving a potential V1 to the electrode 27 for electric charge injection and giving a potential V2 (<V1) to the input electrode 15. If V1-V2 is a voltage which is high enough to provoke tunneling of the insulating film 26, the holes can be easily injected into the floating gate electrode 25.

Here, the insulating layer 26 is formed sufficiently thin in order to facilitate tunneling of the holes. Moreover, a thickness of the insulating layer 26 is set to a value with which the holes stored in the floating gate electrode 25 are not discharged for a long period of time. For example, the thickness of the insulating layer 26 is set to approximately 8 nm, and V1–V2 is set to approximately 10 V.

A threshold value of the switch can be adjusted based on a quantity of the electric charge (the holes) stored in the floating gate electrode 17 and a fixed potential Vbg given to the back gate electrode BG.

The switch is turned on/off by supplying the control signal φfg to the upper electrode of the capacitor as the forward gate electrode FG.

When the control signal φfg is "H", e.g., Vdd (<Vss), negative electric charge is stored in the lower electrode of the capacitor as the forward gate electrode FG. As a result, an electrostatic attraction is generated between the forward gate electrode FG and the floating gate electrode 17, and the movable portion 14 and the floating gate electrode 25 are elastically deformed. Then, the movable portion 14 comes into contact with the output electrode 13, thereby turning on the switch.

When the switch is turned on, an input signal φin as transfer data is transferred to the output electrode 13 from the input electrode 15, and it is output as an output signal φout. The transfer data is, e.g., binary data ("H" or "L").

When the control signal φfg is changed to "L", e.g., Vss, the negative electric charge stored in the lower electrode of the capacitor as the forward gate electrode FG is lost. As a result, the electrostatic attraction between the forward gate electrode FG and the floating gate electrode 14 is not generated, and the movable portion 14 moves away from the output electrode 13 by an elastic force thereof to return to its original state, thereby turning off the switch.

Such a mechanical element is equivalent to an N channel MOS transistor using silicon. That is, since the mechanical element is turned on when the control signal φfg is "H" and it is turned off when this signal is "L", substituting this mechanical element for the N channel MOS transistor can achieve an increase in a speed and realization of a three-dimensional structure of an integrated circuit.

Additionally, according to this mechanical element, the electrostatic force is generated between the forward gate electrode FG and the floating gate electrode 25, and it does not affect the movable portion 14 as a path for transfer data. Therefore, even if this mechanical element is applied to a logic circuit which simultaneously performs an on/off switching operation of the switch and transfer of transfer data, a threshold value of the switch hardly fluctuates, and a stable operation is possible.

Further, the movable portion 14 and the floating gate electrode 15 are formed in the same layer, and they are separated from each other by the insulating layer 28. Therefore, the path for transfer data and a part where the electrostatic force is generated can be completed separated from each other, and hence the threshold value of the switch does not fluctuate in accordance with a value of the transfer data.

Furthermore, since the forward gate electrode FG and the back gate electrode BG can be respectively provided above and below the floating gate electrode 25, the threshold value of the switch can be adjusted even after injection of the electric charge into the floating gate electrode 25.

(8) Sixth Embodiment

Figure 21:
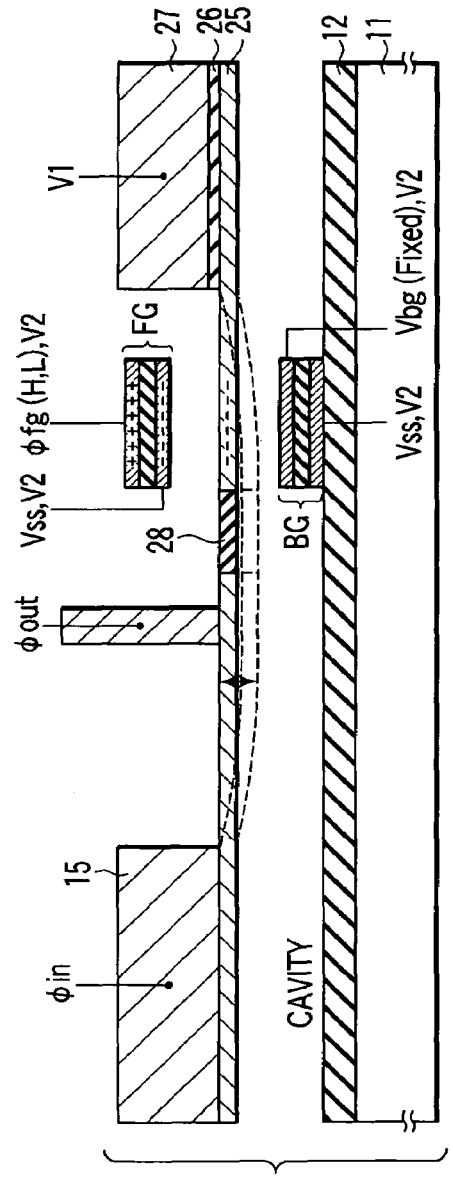
FIG. 21 is a cross-sectional view showing a mechanical element according to a sixth embodiment.

FIG. 21 shows a mechanical element as a sixth embodiment.

This mechanical element functions as a normally-ON type switch.

A back gate electrode BG is formed on an insulating layer 12 on a semiconductor substrate 11. A movable portion 14 and a floating gate electrode 25 are formed above the back gate electrode BG. A region between the insulating layer 12 and the movable portion 14 and between the insulating layer 12 and the floating gate electrode 25 is a cavity.

The back gate electrode BG comprises, e.g., a capacitor. A fixed potential Vbg is given to an upper electrode of this capacitor on the floating gate electrode 25 side, and a ground potential Vss is given to a lower electrode of the same.

Although the movable portion 14 and the floating gate electrode 25 are formed in the same layer, they are electrically separated from each other by an insulating layer (e.g., silicon oxide) 28. However, the movable portion 14, the floating gate electrode 25 and the insulating layer 28 are physically coupled with each other, and they can move as one body.

The movable portion 14 and the floating gate electrode 25 are formed of a material having both elasticity and tenacity, e.g., a material containing carbon such as a carbon nanotube. In case of forming the movable portion 14 and the floating gate electrode 25 by using the carbon nanotubes, each of the movable portion 14 and the floating gate electrode 25 is a bundle of the regularly arranged carbon nanotubes.

An input electrode 15 is formed on the movable portion 14. Furthermore, an output electrode 13 is formed on the movable portion 14. Although the output electrode 13 is in contact with the movable portion 14, they are not physically coupled with each other.

An electrode 27 for electric charge injection is formed on the floating gate electrode 25 through an insulating layer (e.g., silicon oxide) 26. A forward gate electrode FG is formed above the floating gate electrode 25.

The forward gate electrode FG comprises, e.g., a capacitor. A fixed potential (e.g., a ground potential) Vss is given to a lower electrode of this capacitor on the floating gate electrode 25 side, and a control signal φfg is input to an upper electrode of the same.

The floating gate electrode 25 is a member which generates an electrostatic force between the forward gate electrode FG and the back gate electrode BG, and electric charge is stored in the floating gate electrode 25. In this example, negative electric charge (electrons) is stored in the floating gate electrode 25.

The electrons are injected into the floating gate electrode 25 by, e.g., giving a potential V1 to the electrode 27 for electric charge injection and giving a potential V2 (>V1) to the input electrode 15. If V2−V1 is a voltage which is sufficient to provoke tunneling of the insulating film 26, the electrons can be readily injected into the floating gate electrode 25.

Here, the insulating layer 26 is formed sufficiently thin in order to facilitate tunneling of the electrons. Moreover, a thickness of the insulating layer 26 is set to a value with which the electrons stored in the floating gate electrode 25 are not discharged for a long period of time. For example, the thickness of the insulating layer 26 is set to approximately 8 nm, and V2−V1 is set to approximately 10V.

A threshold value of the switch can be adjusted based on a quantity of the electric charge (electrons) stored in the floating gate electrode 17 and the fixed potential Vbg given to the back gate electrode BG.

The switch is turned on/off by, e.g., supplying the control signal φfg to the upper electrode of the capacitor as the forward gate electrode FG.

When the control signal φfg is "H", e.g., Vdd (>Vss), negative electric charge is stored in the lower electrode of the capacitor as the forward gate electrode FG. As a result, an electrostatic repulsive force is generated between the forward gate electrode FG and the floating gate electrode 17, and the movable portion 14 and the floating gate electrode 25 are elastically deformed. Then, the movable portion 14 moves away from the output electrode 13, thereby turning off the switch.

When the control signal φfg is changed to "L", e.g., Vss, the negative electric charge stored in the lower electrode of the capacitor as the forward gate electrode FG is lost. As a result, the electrostatic repulsive force between the forward gate electrode FG and the floating gate electrode 17 is not generated, and the movable portion 14 returns to its original state by an elastic force thereof to come into contact with the output electrode 13, thereby turning on the switch.

When the switch is turned on, an input signal φin as transfer data is transferred to the output electrode 13 from the input electrode 15, and it is output as an output signal φout. The transfer data is, e.g., binary data ("H" or "L").

Such a mechanical element is equivalent to a P channel MOS transistor using silicon. That is, since the mechanical element is turned off when the control signal φfg is "H" and it is turned on when this signal is "L", substituting the P channel MOS transistor with this mechanical element can achieve an increase in a speed and realization of a three-dimensional structure of an integrated circuit.

Additionally, according to this mechanical element, the electrostatic force is generated between the forward gate electrode FG and the floating gate electrode 25, and it does not affect the movable portion 14 as a path for transfer data. Therefore, even if this mechanical element is applied to a logic circuit which simultaneously performs an on/off switching operation of the switch and transfer of transfer data, a threshold value of the switch hardly fluctuates and a stable operation is possible.

Further, the movable portion 14 and the floating gate electrode 25 are formed in the same layer, and they are separated from each other by the insulating layer 28. Therefore, the path for transfer data and the part where the electrostatic force is generated can be completely separated from each other, and hence the threshold value of the switch does not fluctuate depending on a value of the transfer data.

Furthermore, since the forward gate electrode FG and the back gate electrode BG can be respectively provided above and below the floating gate electrode 25, the threshold value of the switch can be adjusted even after injection of the electric charge into the floating gate electrode 25.

(9) Modifications

In the fifth and sixth embodiments, the output electrode may be provided above the movable portion or may be provided below the movable portion.

For example, in an example of FIG. 22, an output electrode 13 of the mechanical element (a normally-OFF type switch) according to the fifth embodiment is arranged below a movable portion 14, and negative electric charge (electrons) is stored in a floating gate electrode 25.

In this case, when a control signal φfg is changed to "H", e.g., Vdd (>Vss), negative electric charge is stored in a lower electrode of a capacitor as a forward gate electrode FG. As a result, an electrostatic repulsive force is generated between the forward gate electrode FG and the floating gate electrode 17, and the movable portion 14 and the floating gate electrode 25 are elastically deformed. Then, the movable portion 14 comes into contact with the output electrode 13, thereby turning on the switch.

When the control signal φfg is changed to "L", e.g., Vss, the negative electric charge stored in the lower electrode of the capacitor as the forward gate electrode FG is lost. As a result, an electrostatic attraction between the forward gate electrode FG and the floating gate electrode 17 is not generated, and the movable portion 14 moves away from the output electrode 13 by an elastic force thereof to return to its original state, thereby turning off the switch.

In an example of FIG. 23, an output electrode 13 of the mechanical element (a normally-ON type switch) according to the sixth embodiment is arranged below a movable portion 14, and positive electric charge (holes) is stored in a floating gate electrode 25.

In this case, when a control signal φfg is "H", e.g., Vdd (>Vss), negative electric charge is stored in a lower electrode of a capacitor as a forward gate electrode FG. As a result, an electrostatic attraction is generated between the forward gate electrode FG and the floating gate electrode 17, and the movable portion 14 and the floating gate electrode 25 are elastically deformed. Then, the movable portion 14 is separated from the output electrode 13, thereby turning off the switch.

When the control signal φfg is changed to "L", e.g., Vss, the negative electric charge stored in the lower electrode of the capacitor as the forward gate electrode FG is lost. As a result, the electrostatic attraction between the forward gate electrode FG and the floating gate electrode 17 is not generated, and the movable portion 14 returns to its original state by an elastic force thereof to come into contact with the output electrode 13, thereby turning on the switch.

In such a configuration, the same effects as those of the fifth and sixth embodiments can be obtained.

(10) Seventh Embodiment

In the first to sixth embodiment and the modifications, although the movable portion moves in a lengthwise direction, i.e., a vertical direction (an up-and-down direction) with respect to a surface of the semiconductor substrate, but a seventh embodiment proposes a configuration in which the movable portion moves in a lateral direction, i.e., a horizontal direction (a right-and-left direction) with respect to the surface of the semiconductor substrate.

Figure 24:
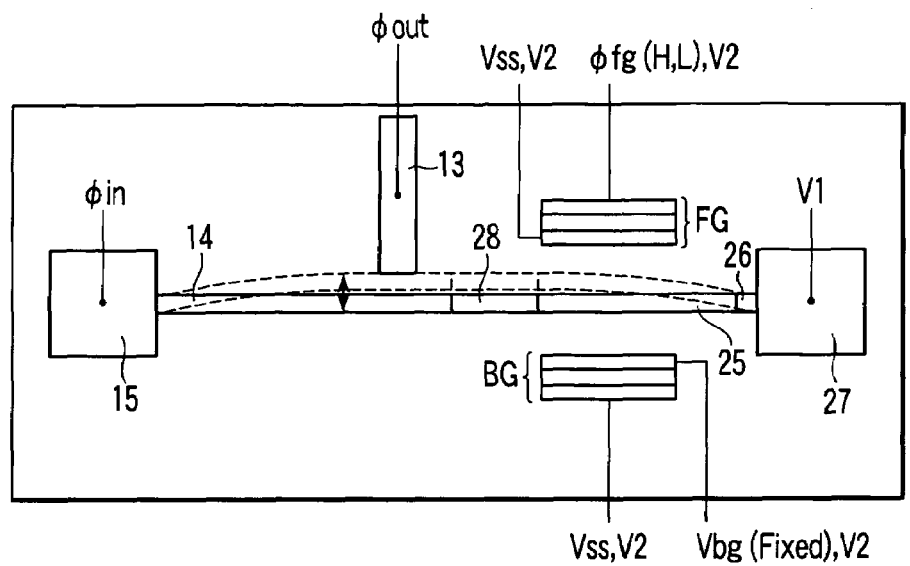
FIG. 24 is a cross-sectional view showing a mechanical element according to a seventh embodiment.
Figure 25:
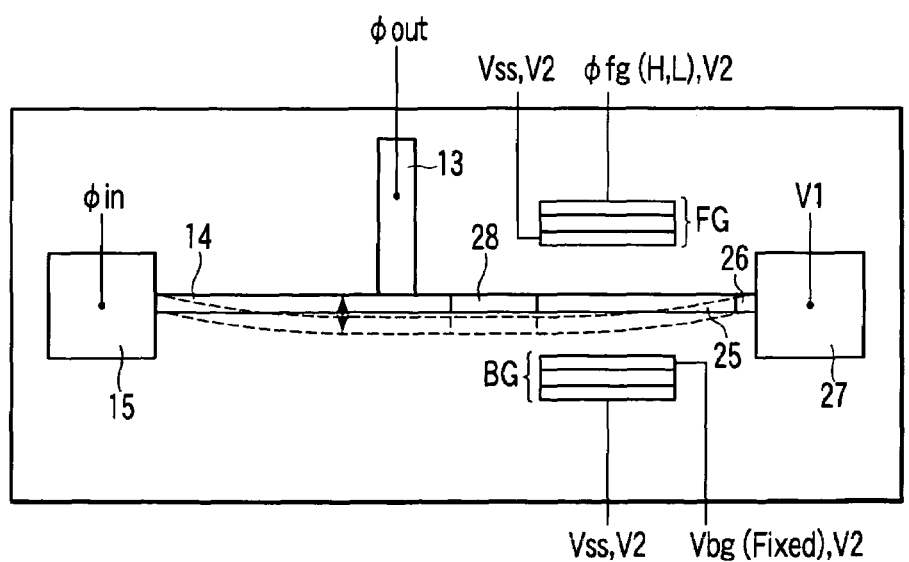
FIG. 25 is a cross-sectional view showing a mechanical element according to the seventh embodiment.

FIGS. 24 and 25 show mechanical elements as the seventh embodiment.

A mechanical element shown in FIG. 24 functions as a normally-OFF type switch, and a mechanical element depicted in FIG. 25 functions as a normally-ON type switch.

An output electrode 13, an input electrode 15 and an electrode 27 for electric charge injection are arranged on an insulating layer on a semiconductor substrate. A movable portion 14, a floating gate electrode 25 and insulating layers 26 and 28 are coupled in series and formed into a rod-like or strip-like shape between the input electrode 15 and the electrode 27 for electric charge injection.

The movable portion 14, the floating gate electrode 25 and the insulating layers 26 and 28 are physically coupled with each other. Moreover, the movable portion 14, the floating gate electrode 25 and the insulating layers 26 and 28 may be or may not be in contact with the insulating layer on the semiconductor substrate, but they are configured to move in at least a lateral direction.

The movable portion 14 and the floating gate electrode 25 are formed of a material having both elasticity and tenacity, e.g., a material containing carbon such as a carbon nanotube. In case of forming the movable portion 14 and the floating gate electrode 25 by using the carbon nanotubes, each of the movable portion 14 and the floating gate electrode 25 is a bundle of the regularly arranged carbon nanotubes.

The output electrode 13 is separated from the movable portion 14 in the example shown in FIG. 24, but it is in contact with the movable portion 14 in the example depicted in FIG. 25. Even though the movable portion 14 is in contact with the output electrode 13, they are not physically coupled with each other.

A forward gate electrode FG is formed on one side of the floating gate electrode 25 in the lateral direction, and a back gate electrode BG is formed on the other side of the same.

The forward gate electrode FG comprises, e.g., a capacitor. A fixed potential (e.g., a ground potential) Vss is given to a lower electrode of this capacitor on the floating gate electrode 25 side, and a control signal φfg is input to an upper electrode of the same.

The back gate electrode BG also comprises, e.g., a capacitor. A fixed potential Vbg is given to an upper electrode of this capacitor on the floating gate electrode 25 side, and a ground potential Vss is given to a lower electrode of the same.

Here, the floating gate electrode 25 is a member which generates an electrostatic force between the forward gate electrode FG and the back gate electrode BG, and electric charge (electrons or holes) is stored in the floating gate electrode 25.

The electric charge is injected into the floating gate electrode 25 by giving a potential V1 to the electrode 27 for electric charge injection and giving a potential V2 to the input electrode 15. If a difference between V1 and V2 is a voltage which is sufficient to provoke tunneling of the insulating film 26, the electric charge can be readily injected into the floating gate electrode 25.

Here, the insulating layer 26 is formed sufficiently thin in order to facilitate tunneling of the electric charge. Further, a thickness of the insulating layer 26 is set to a value with which the electric charge stored in the floating gate electrode 25 is not discharged for a long period of time. For example, the thickness of the insulating layer 26 is set to approximately 8 nm, and the difference between V1 and V2 is set to approximately 10 V.

A threshold value of the switch can be adjusted based on a quantity of the electric charge stored in the floating gate electrode 17 and the fixed potential Vbg given to the back gate electrode BG.

The switch is turned on/of by, e.g., supplying the control signal φfg to the upper electrode of the capacitor as the forward gate electrode FG and moving the movable portion 14 in the lateral direction with an electrostatic attraction or an electrostatic repulsive force generated between the floating gate electrode 25 and the forward gate electrode FG and between the floating gate electrode 25 and the back gate electrode BG.

Such a mechanical element is also equivalent to an N channel MOS transistor or a P channel MOS transistor using silicon. Therefore, substituting the N channel MOS transistor and the P channel MOS transistor with this mechanical element can achieve an increase in a speed and realization of a three-dimensional structure of an integrated circuit.

Furthermore, according to this mechanical element, the electrostatic force is generated between the forward gate electrode FG and the floating gate electrode 25, and it does not affect the movable portion 14 as a path for transfer data. Therefore, even if the mechanical element is applied to a logic circuit which simultaneously performs an on/off switching operation of the switch and transfer of transfer data, a threshold value of the switch hardly fluctuates and a stable operation is possible.

Moreover, the movable portion 14 and the floating gate electrode 25 are formed in the same layer, and they are separated from each other by the insulating layer 28. Therefore, the path for transfer data and the part where the electrostatic force is generated can be completely separated from each other, the threshold value of the switch does not fluctuate in accordance with a value of the transfer data.

Additionally, since the forward gate electrode FG and the back gate electrode BG can be respectively provided on the right and left sides of the floating gate electrode 25, the threshold value of the switch can be adjusted even after injection of the electric charge into the floating gate electrode 25.

(11) Conclusion

As described above, according to the first to seventh embodiments and the modifications, an arithmetic capacity of an integrated circuit can be greatly improved by forming a part or all of the switching element constituting the integrated circuit by using the mechanical element which can operate at a high speed and realize a three-dimensional structure.

For example, when a shape of the movable portion is of a strip type having a width w, a thickness d and a length l, a spring constant kc and a resonance frequency fc of the movable portion can be respectively expressed as follows:

$$kc = (wd^3/4l^3) \times E$$

$$fc = 0.56 \times (d/l^2) \times (E/12\rho)^{1/2}$$

where E is a Young's constant (<1 TPa) of a material constituting the movable portion, and $\rho$ is a density of the material constituting the movable portion (e.g., approximately 1.3 g/cm$^3$).

In this case, when l=50 nm, the resonance frequency fc is approximately 10 GHz. When l=10 nm, the resonance frequency fc is approximately 240 GHz. Since the characteristics are substantially the same as those of an MOS transistor having a channel length of approximately 0.1 μm, when the mechanical element according to the examples of the present invention is formed into a three-dimensional shape, a speed can be increased to be higher than that of a conventional CMOS circuit of 0.1 sub-μm by an effect of improving a parallel data transfer capability inherent to the three-dimensional structure.

4. Applications

Applications will now be described.
(1) Switch
As described above in conjunction with the first to seventh embodiments and the modifications, the mechanical element according to the example of the present invention can function as, e.g., a switch.

Figure 26:
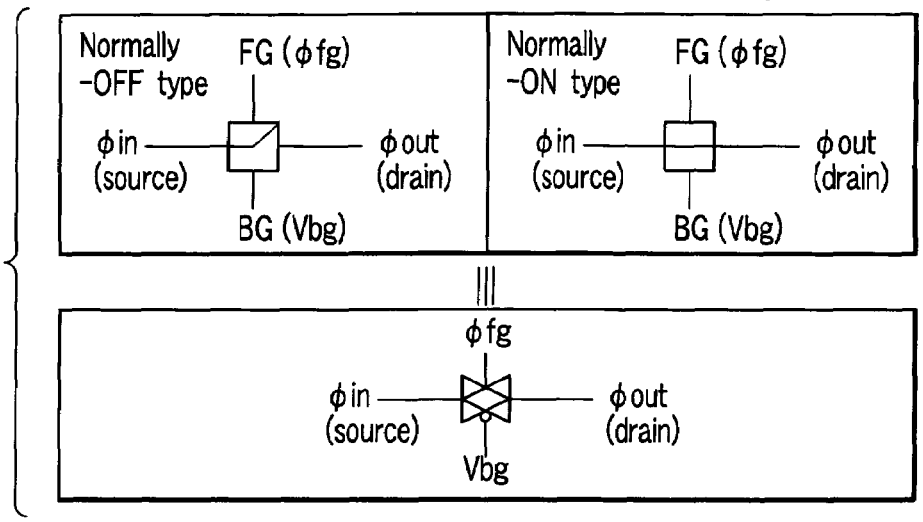
FIG. 26 is a view showing symbols of FES.

Representing this by using symbols, the normally-OFF type and the normally-ON type are respectively as shown in FIG. 26. A basic configuration of the normally-ON type is the same as that of a transfer gate which is a CMOS switch.

Here, such a mechanical switch will be referred to as a four-terminal electromechanical switch, i.e., FES. It is assumed that the FES includes a three-terminal electro-mechanical switch which does not have a back gate electrode BG.

In regard to the switch having no back gate electrode BG, eliminating the part of the back gate electrode BG as a symbol can suffice.

According to the FES concerning the example of the present invention, the following effects can be obtained.

A. A threshold value of the switch is not affected by an input signal φin and an output signal φout.

B. An ON resistance between input/output electrodes is small.

c. A computing speed (a switching speed+a speed at which electric charge is stored in a gate) is high. In particular, the latter speed which can be a rate-limiting factor can be improved in a CMOS circuit.

d. A multi-layer can be readily formed. It is good enough to just repeat processes such as film formation, lithography, etching, flattening and the like.

e. A power supply voltage is a low voltage equivalent to that of the CMOS circuit.

(2) Inverter

The two mechanical switches concerning the example of the present invention can be combined to constitute an inverter. For example, combining the normally-OFF type switch with the normally-ON type switch can constitute an inverter.

A function of the inverter constituted of the mechanical switches is the same as that of a CMOS inverter formed on silicon, but characteristics of the inverter are greatly improved as compared with those of the CMOS inverter.

Figure 27:
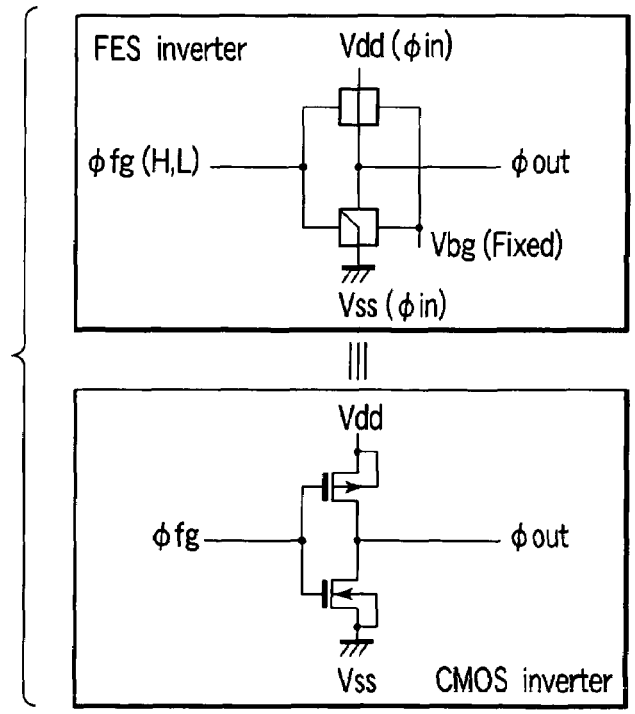
FIG. 27 is a circuit diagram showing FES inverter.

A circuit diagram is as shown in FIG. 27.

Here, such an inverter constituted of the mechanical switches will be referred to as an FES inverter. The FES inverter includes an inverter comprising an FES having no back gate electrode BG.

As to the FES switch comprising a switch having no back gate electrode BG, eliminating the part of the back gate electrode BG as a symbol can suffice.

According to the FES concerning the example of the present invention, a through current which is a problem in, e.g., a CMOS inverter can be eliminated.

That is, as shown in FIG. 28, shifting threshold values of the two mechanical switches constituting the FES inverter from each other can completely eliminate the through current generated at the time of an on/off switching operation, which contributes to a reduction in power consumption.

(3) Logic Circuit

Figure 29:
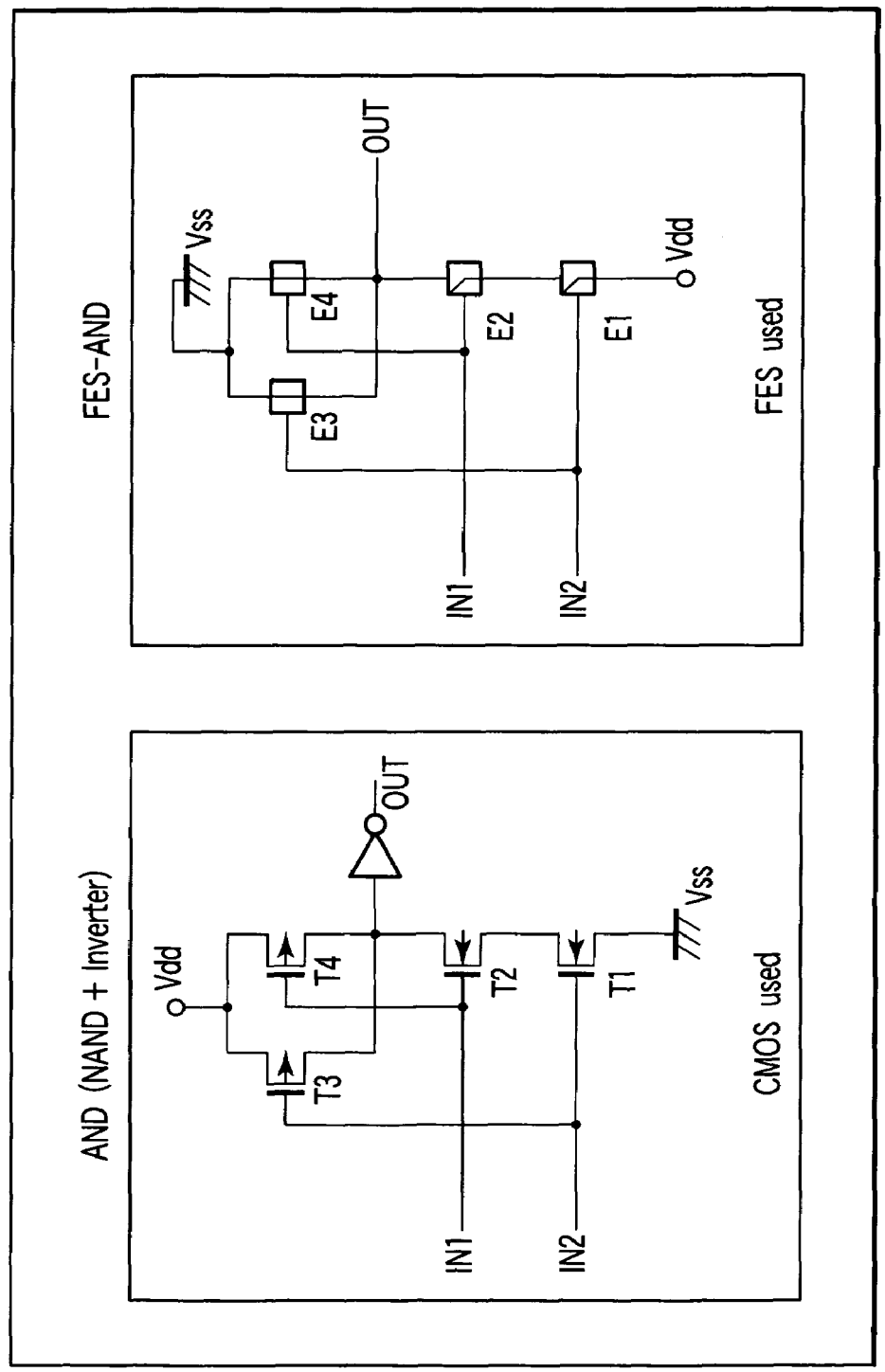
FIG. 29 is a circuit diagram showing FES-.

A logic circuit can be constituted by combining the mechanical switches concerning the example of the present invention. For example, as shown in FIG. 29, an AND gate circuit can be constituted by using the four mechanical switches.

Although a function of the AND gate circuit including the mechanical switches is the same as that of an AND gate circuit based on a CMOS circuit, characteristics of the former circuit are greatly improved as compared with the AND gate circuit based on the CMOS circuit.

Here, such an AND gate circuit comprising the mechanical switches will be referred to as an FES-AND.

In this example, an FES-AND including an FES having no back gate electrode BG is proposed, but the FES-AND can be constituted by using an FES having a back gate electrode BG.

According to the FES-AND concerning the example of the present invention, the mechanical switches connected in parallel between a power supply terminal Vdd and an output terminal OUT are of the normally-ON type and the mechanical switches connected in series between the output terminal OUT and a power supply terminal (a ground terminal) Vss are of the normally-OFF type, thereby constituting the AND gate circuit.

On the contrary, in case of constituting an AND gate circuit based on a CMOS circuit, the AND gate circuit is constituted by using a combination of an NAND gate circuit and an inverter. That is, the number of elements in the AND gate circuit based on the CMOS circuit is increased because of the inverter as compared with the AND gate circuit comprising the mechanical switches.

Therefore, according to the example of the present invention, it is possible to obtain an effect that the AND gate circuit can be constituted with the fewer number of the elements.

A logic circuit other than the AND gate circuit can be constituted by using a combination of the AND gate circuit and the inverter. Therefore, by forming the AND gate circuit and the inverter by using the FES, any other logic circuit can be also constituted of the FES.

Figure 30:
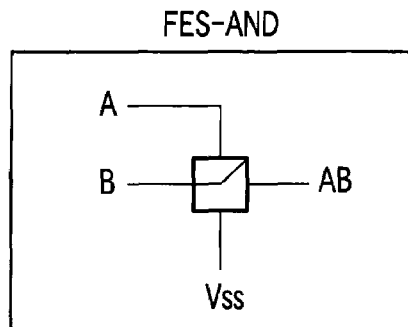
FIG. 30 is a view showing symbols of FES-.
Figure 31:
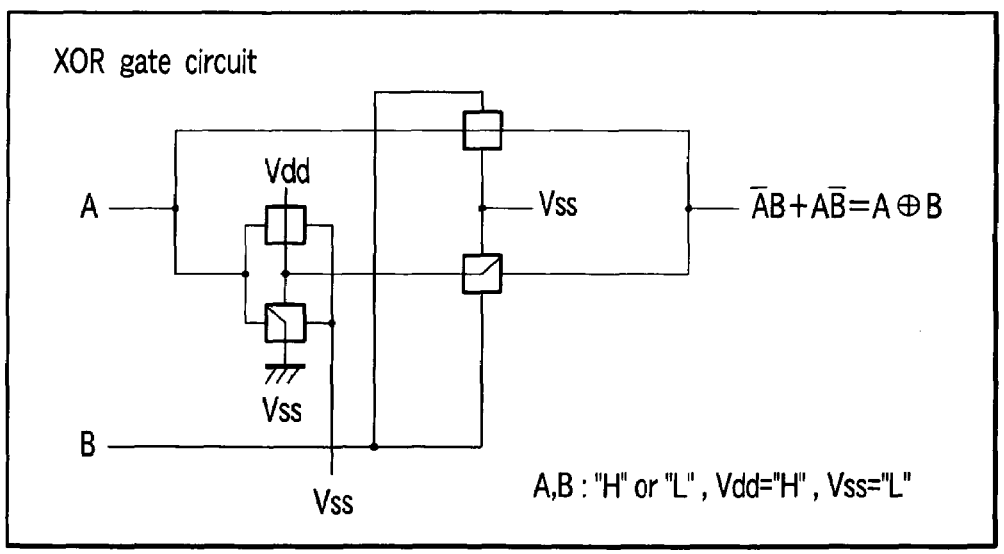
FIG. 31 is a circuit diagram showing XOR gate circuit.

Furthermore, according to the example of the present invention, as shown in FIG. 30, an AND gate circuit can be constituted of one FES. In this case, an exclusive OR (XOR) gate circuit can be shown in a circuit diagram such as FIG. 31.

The FES-AND shown in FIG. 29 is superior to the FES-AND depicted in FIG. 30 in stability of an operation, and the FES-AND in FIG. 30 is superior to the FES-AND in FIG. 29 in the number of elements.

(4) MEMS Inverter

According to an example of the present invention, a logic circuit can comprise one FES. For example, although logic elements shown in FIGS. 32 and 33 are similar to the configuration of the mechanical switch according to the fifth embodiment, they are greatly different from the fifth embodiment in that each of these elements alone functions as an inverter.

That is, an electrode 13A to which a power supply potential Vdd is applied is formed below a movable portion 14, and an electrode 13B to which a power supply potential Vss is applied is formed above the movable portion 14. An output electrode 15 is formed on the movable portion 14.

Although a forward gate electrode FG alone is formed as a control gate electrode in the example of FIG. 32, but two electrodes, i.e., the forward gate electrode FG and a back gate electrode BG are provided as the control gate electrodes in the example of FIG. 33.

An electrostatic attraction or an electrostatic repulsive force is generated to move the movable portion 14 in an up-and-down direction so that the movable portion 14 is brought into contact with the electrodes 13A and 13B, thereby forming an inverter. Such an inverter will be referred to as a MEMS inverter in order to discriminate from the FES inverter.

(5) MEMS Multiplexer

According to an example of the present invention, as shown in FIGS. 34 and 35, a multiplexer can comprise one FES.

That is, a first output electrode 13A is formed below a movable portion 14, and a second output electrode 13B is formed above the movable portion 14. An input electrode 15 is formed on the movable portion 14.

Although a forward gate electrode FG alone is formed as a control gate electrode in the example of FIG. 34, two electrodes, i.e., the forward gate electrode FG and a back gate electrode BG are provided as the control gate electrodes in the example of FIG. 35.

An electrostatic attraction or an electrostatic repulsive force is generated to move the movable portion 14 in an up-and-down direction so that the movable portion 14 comes into contact with the first output electrode 13A or the second output electrode 13B, thereby forming a multiplexer. Such a multiplexer will be referred to as a MEMS multiplexer.

5. APPLICATION EXAMPLES

Application examples will now be described.

(1) Semiconductor Memory

FIG. 36 shows a semiconductor memory to which an example of the present invention can be applied.

As elements constituting the semiconductor memory, there are roughly a memory cell array and a peripheral circuit. In a two-dimensional layout in which the memory cell array and the peripheral circuit are arranged on a chip 10, there is already a limit in density growth of elements due to miniaturization (FIG. 36(a)).

Therefore, although realization of a three-dimensional structure of the semiconductor memory has been examined, a laminated structure of the memory cell array can be relatively easily realized, whereas realization of a three-dimensional structure of the peripheral circuit as a logic circuit is very difficult. That is because laminating MOS transistors as switches is difficult (FIG. 36(b)).

In the example of the present invention, the peripheral circuit comprises a mechanical switch in place of the MOS transistor, and hence a laminated structure of the peripheral circuit can be also relatively easily realized. Therefore, according to the example of the present invention, a true three-dimensional structure can be realized (FIG. 36(c)).

Figure 37:
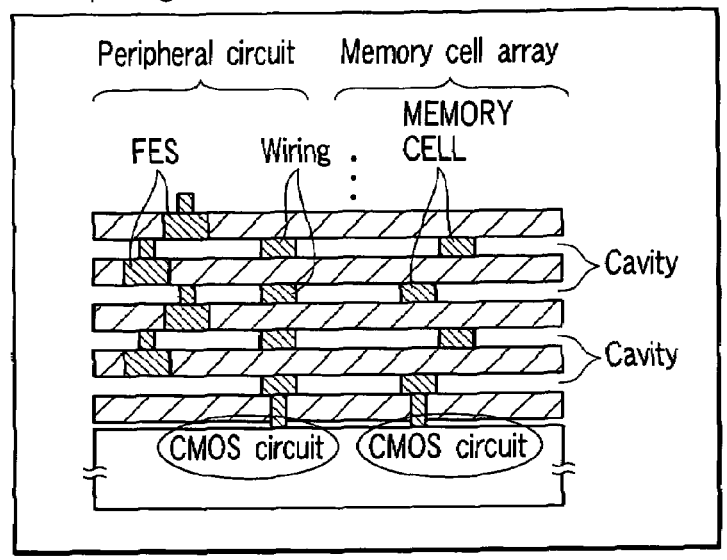
FIG. 37 is a view showing an example of realization of a three-dimensional structure of a semiconductor memory.

FIG. 37 shows an image of a three-dimensional laminated structure of a semiconductor memory.

CMOS circuits (including selection transistors in memory cell arrays) are formed in a surface region of a semiconductor substrate. Memory cells (e.g., magneto-resistive effect elements) are superimposed in a memory cell array region, and, e.g., FES are superimposed in a peripheral circuit region.

Although wirings are also superimposed, a peripheral region around the wirings is determined as a cavity by utilizing a cavity required for the mechanical element, thereby realizing a so-called aerial wiring structure. In this case, a parasitic capacitance generated between the wirings is reduced, which contributes to a higher-speed operation.

It is to be noted that the application of the example of the present invention is not restricted to types of the semiconductor memory. For instance, the example of the present invention can be applied to a PRAM (a programmable random access memory), an MRAM (a magnetic random access memory) or the like.

(2) System LSI

An LSI described herein includes an LSI in which a plurality of functions are provided in one chip, e.g., a microcomputer, a microprocessor, a graphic processor, a DSP, an arithmetic processing circuit and others.

The first merit of realization of a three-dimensional structure is that an information transmission speed can be improved, namely, a bandwidth can be increased. That is because circuit blocks are adjacent to each other with surfaces as boundaries in place of lines in a three-dimensional layout, hence each bus connecting the circuit blocks can be shortened and the number of such buses can be increased as compared with a two-dimensional layout.

Figure 38:
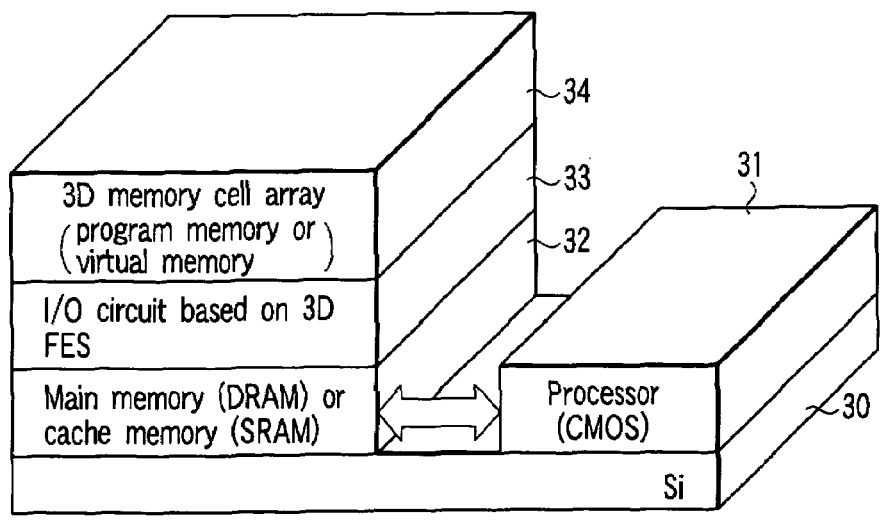
FIG. 38 is a view showing an example of realization of a three-dimensional structure of a system LSI.

FIG. 38 shows a first example of a system LSI.

A processor (a CMOS circuit) 31 and a circuit block 32 comprising a main memory (a DRAM) or a cache memory (an SRAM) are formed on a chip (a silicon substrate) 30.

An I/O circuit (an interface circuit) 33 comprising, e.g., an FES is formed on the circuit block 32 comprising the main memory or the cache memory. Furthermore, a memory cell array (a program memory or a virtual memory) 34 is formed on the I/O circuit 33 comprising the FES.

Realization of a three-dimensional structure can be facilitated by adopting a non-volatile semiconductor memory such as an FeRAM (a ferroelectric random access memory), a PRAM, an MRAM or the like for the program memory or the virtual memory.

The main memory or the cache memory formed on the chip 30 is connected with the processor 31 through a bus.

Moreover, the main memory or the cache memory is usually connected with the program memory or the virtual memory through the bus. In a recent microprocessor, an information transmission quantity in this bus often controls an entire computing speed. This is a so-called bottleneck of the bus.

Thus, in the example according to the present invention, the I/O circuit 33 comprising the FES substitutes for this bus.

As a result, an information transmission quantity and an information transmission speed between the main memory or the cache memory and the program memory or the virtual memory can be greatly increased.

Figure 39:
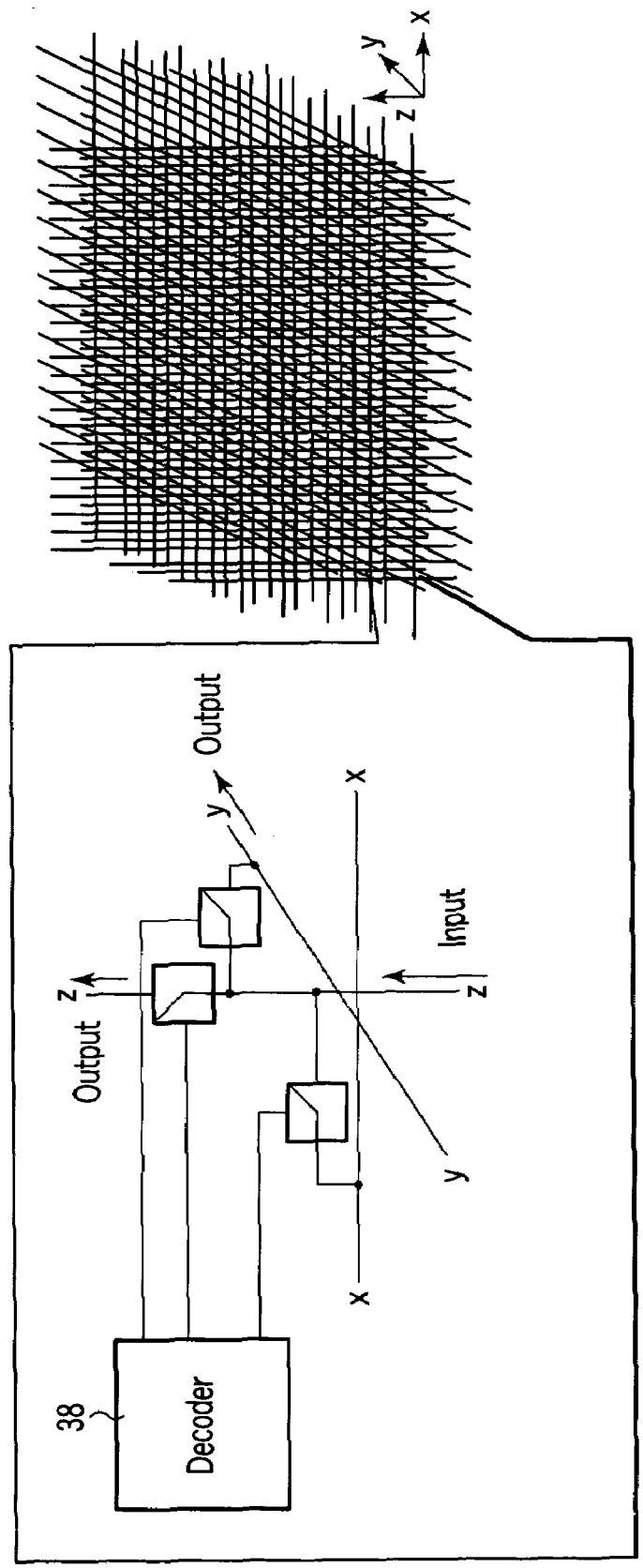
FIG. 39 is a view showing an example of an interface circuit.

FIG. 39 shows an example of the I/O circuit comprising the FES depicted in FIG. 38.

This is a three-dimensional crossbar on-chip bus interface circuit.

Three I/O circuits each comprising an FES are arranged at respective intersections of wirings arranged in a longitudinal direction and a lateral direction. Some of the wirings extending in directions x, y and z which are to be connected with each other are determined in accordance with output signals A, B and C from a decoder 38.

Of the output signals A, B and C from the decoder 38, one is set to "H", the remaining signals are set to "L", and one switch along to which "H" is input is turned on. For example, the signal from the direction z is transferred to one of the directions x, y and z.

When the wirings are three-dimensionally arranged and the switches are arranged at the intersections of these wirings in this manner, the wirings are directly coupled with each other in a relationship of 1:1 through input/output terminals at a part where two surfaces cross each other, thereby providing a bus circuit with the highest speed.

Figure 40:
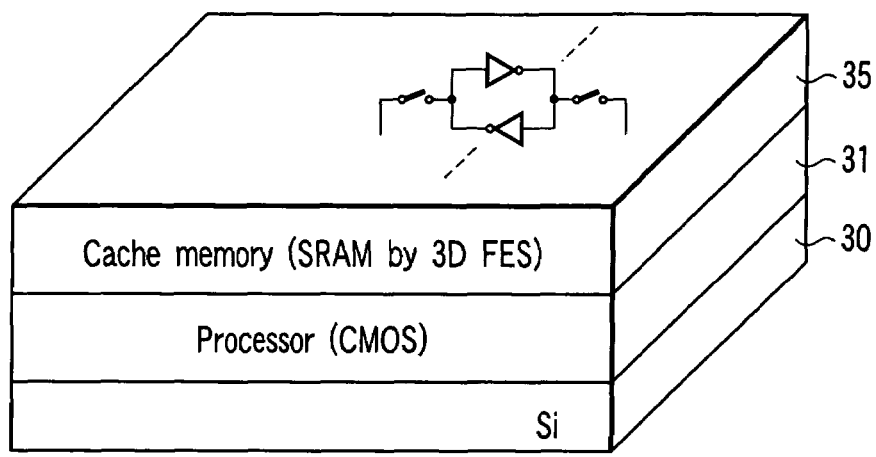
FIG. 40 is a view showing an example of realization of a three-dimensional structure of a system LSI.

FIG. 40 shows a second example of the system LSI.

A processor (a CMOS circuit) 31 is formed on a chip (a silicon substrate) 30, and a cache memory 35 is formed on the processor 31. The cache memory 35 comprises an SRAM (a static random access memory).

As well known, the SRAM comprises two inverters which are flip-flop-connected and two switches. That is, according to the example of the present invention, the SRAM as the cache memory 35 can comprise, e.g., FES and FES inverters, thereby realizing a three-dimensional structure.

It is to be noted that an interface circuit between the processor 31 and the cache memory 35 can likewise comprise an FES.

Figure 41:
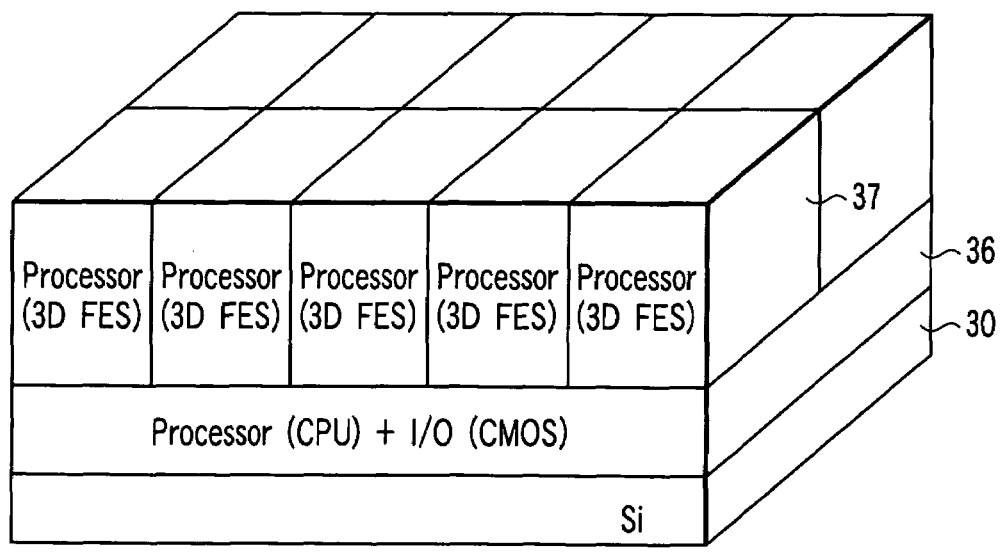
FIG. 41 is a view showing an example of realization of a three-dimensional structure of a system LSI.

FIG. 41 shows a third example of the system LSI.

This is an arithmetic processing apparatus in which a plurality of duplicate blocks having the same function are mounted in one chip.

This technology simultaneously operates a plurality of processors (the duplicate blocks) 36 to improve an arithmetic processing capacity, but realizing a three-dimensional structure based on the FES can further improve the arithmetic processing capacity.

On a chip (a silicon substrate) 30 is formed a circuit block 36 comprising a processor (a CPU) as a control circuit and an I/O circuit (a CMOS circuit) as an interface circuit. A plurality of processors 36 as signal processing circuits are formed on this circuit block 36.

The plurality of processors 36 are an aggregate of logic circuits and registers and comprise FES, and they are all formed with the same configuration and the same layout.

It is to be noted that the I/O circuit as the interface circuit can likewise comprise the FES.

Besides the first to third examples, a three-dimensional structure can be realized with respect to various system LSIs by utilizing the FES.

(3) Others

The example of the present invention can be applied to a logic LSI, a memory-loaded logic LSI or the like. Moreover, the example of the present invention can be applied to a discrete product in which one function (e.g., an inverter or a multiplexer) alone is formed in one chip.

6. Others

According to the example of the present invention, a high-speed operation and a three-dimensional structure of the switching element can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A switching element comprising:
    a first input/output electrode;
    a movable portion which repeats contact/non-contact with respect to the first input/output electrode;
    a second input/output electrode connected with the movable portion;
    a floating gate electrode combined with the movable portion through an insulating layer and in which electric charge is stored; and
    a first gate electrode which generates an electrostatic force between itself and the floating gate electrode to control an operation of the movable portion, the first gate electrode including first and second capacitor electrodes, both of the first and second capacitor electrodes being disposed on a same side of the movable portion as the floating gate electrode.

2. The switching element according to claim 1, wherein the movable portion does not come into contact with the first input/output electrode in a state where the electrostatic force is not generated.

3. The switching element according to claim 1, wherein the movable portion comes into contact with the first input/output electrode in a state where the electrostatic force is not generated.

4. The switching element according to claim 1, wherein the floating gate electrode is arranged on the movable portion.

5. The switching element according to claim 4, wherein the insulating layer has a function of provoking tunneling of the electric charge.

6. The switching element according to claim 4, further comprising a shield layer which is arranged between the floating gate electrode and the movable portion and shields against the electrostatic force.

7. The switching element according to claim 1, wherein the floating gate electrode and the movable portion are arranged in the same layer.

8. The switching element according to claim 7, further comprising an electrode for electric charge injection which is connected with the floating gate electrode through the insulating layer having the function of provoking tunneling of the electric charge.

9. The switching element according to claim 1, wherein a movable direction of the movable portion is a vertical direction with respect to a surface of a semiconductor substrate.

10. The switching element according to claim 1, wherein a movable direction of the movable portion is a horizontal direction with respect to a surface of a semiconductor substrate.

11. The switching element according to claim 1, further comprising a second gate electrode which is used with the first gate electrode as a pair to control the operation of the movable portion.

12. The switching element according to claim 1, wherein the movable portion is formed of carbon nanotubes or a material containing carbon.

13. The switching element according to claim 1, wherein the movable portion is of a doubly-supported beam type.

14. The switching element according to claim 1, wherein the movable portion is of a cantilever type.

15. An FES inverter comprising:
a first switch comprising a switching element according to claim 1; and
a second switch comprising a switching element according to claim 1,
wherein the first and second switches are connected in series.

16. The FES inverter according to claim 15, wherein threshold values of the first and second switches are different from each other.

17. An FES-AND comprising:
first and second switches which are connected in parallel between a ground terminal and an output terminal and each of which comprises a switching element according to claim 1; and
third and fourth switches which are connected in series between a power supply terminal and the output terminal and each of which comprises a switching element according to claim 1.

18. A semiconductor memory comprising:
a plurality of memory cell arrays and a plurality of peripheral circuits superimposed on a semiconductor substrate,
wherein each of the plurality of peripheral circuits has a switching element according to claim 1.

19. A system LSI comprising:
a plurality of circuit blocks superimposed on a semiconductor substrate,
wherein at least one of the plurality of circuit blocks has a switching element according to claim 1.

20. The system LSI according to claim 19, wherein the plurality of circuit blocks comprise: a first circuit block having a main memory or a cache memory; a second circuit block having a program memory or a virtual memory; and an interface circuit arranged between the first and second circuit blocks, the interface circuit comprising the switching element.

21. The system LSI according to claim 20, wherein the interface circuit is a crossbar on-chip bus interface circuit in which the switching element is arranged at an intersection of wirings which are three-dimensionally arranged.

22. The system LSI according to claim 19, wherein the plurality of circuit blocks comprise: a first circuit block having a processor; and a second circuit block which is arranged on the first circuit block and has a cache memory comprising an SRAM, the cache memory comprising the switching element.

23. The system LSI according to claim 19, wherein the plurality of circuit blocks comprise: a first circuit block having a first processor functioning as a CPU; and a second circuit block which is arranged on the first circuit block and has a plurality of second processors functioning as signal processing circuits, the plurality of second processors comprising the switching elements.

* * * * *